(12) United States Patent
Suk et al.

(10) Patent No.: US 11,810,915 B2
(45) Date of Patent: Nov. 7, 2023

(54) SEMICONDUCTOR PACKAGE WITH REDISTRIBUTION SUBSTRATE HAVING EMBEDDED PASSIVE DEVICE

(71) Applicant: SAMSUNG ELECTRONICS CO., LTD., Suwon-si (KR)

(72) Inventors: Kyoung Lim Suk, Suwon-si (KR); Seokhyun Lee, Hwaseong-si (KR); Jaegwon Jang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/359,110

(22) Filed: Jun. 25, 2021

(65) Prior Publication Data
US 2022/0157810 A1 May 19, 2022

(30) Foreign Application Priority Data
Nov. 17, 2020 (KR) .................. 10-2020-0153634

(51) Int. Cl.
*H01L 21/768* (2006.01)
*H01L 23/522* (2006.01)
(Continued)

(52) U.S. Cl.
CPC ...... *H01L 27/0805* (2013.01); *H01L 23/5222* (2013.01); *H01L 23/5386* (2013.01); *H01L 24/14* (2013.01); *H01L 28/60* (2013.01)

(58) Field of Classification Search
CPC ............ H01L 27/0805; H01L 23/5222; H01L 23/5386; H01L 24/14; H01L 28/60
See application file for complete search history.

(56) References Cited

U.S. PATENT DOCUMENTS 6,759,703 B1 * 7/2004 Matsuhashi ............ H01L 28/75
257/E21.582
8,884,431 B2 11/2014 Lin et al.
(Continued)

FOREIGN PATENT DOCUMENTS

CN 110323061 A 10/2019
EP 3179512 A1 6/2017
(Continued)

*Primary Examiner* — Marcos D. Pizarro
*Assistant Examiner* — Tenley H Schofield
(74) *Attorney, Agent, or Firm* — Sughrue Mion, PLLC

(57) ABSTRACT

Disclosed is a semiconductor package including: a redistribution substrate; at least one passive device in the redistribution substrate, the passive device including a first terminal and a second terminal; and a semiconductor chip on a top surface of the redistribution substrate, the semiconductor chip vertically overlapping at least a portion of the passive device, wherein the redistribution substrate includes: a dielectric layer in contact with a first lateral surface, a second lateral surface opposite to the first lateral surface, and a bottom surface of the passive device; a lower conductive pattern on the first terminal; a lower seed pattern provided between the first terminal and the conductive pattern, and directly connected to the first terminal; a first upper conductive pattern on the second terminal and a first upper seed pattern provided between the second terminal and the first upper conductive pattern, and directly connected to the second terminal.

20 Claims, 21 Drawing Sheets

(51) Int. Cl.
  *H01L 23/00* (2006.01)
  *H01L 23/31* (2006.01)
  *H01L 23/495* (2006.01)
  *H01L 23/528* (2006.01)
  *H01L 23/532* (2006.01)
  *H01L 27/08* (2006.01)
  *H01L 23/538* (2006.01)
  *H01L 49/02* (2006.01)

(56) References Cited

U.S. PATENT DOCUMENTS

| | | | |
|---|---|---|---|
| 10,381,302 B2 | 8/2019 | Shih et al. | |
| 2005/0016763 A1 | 1/2005 | Zollo et al. | |
| 2006/0118931 A1 | 6/2006 | Ho et al. | |
| 2007/0263364 A1* | 11/2007 | Kawabe | H05K 1/0231 |
| | | | 257/E23.079 |
| 2007/0287281 A1* | 12/2007 | Wang | H01L 23/5389 |
| | | | 438/618 |
| 2013/0284506 A1* | 10/2013 | Zanma | H05K 1/185 |
| | | | 29/832 |
| 2016/0183379 A1 | 6/2016 | Song et al. | |
| 2016/0322289 A1* | 11/2016 | Kobayashi | H01L 23/49822 |
| 2017/0231094 A1* | 8/2017 | Blackshear | H05K 1/185 |
| 2018/0042115 A1 | 2/2018 | Sato et al. | |
| 2018/0102313 A1 | 4/2018 | Shih | |
| 2019/0304803 A1 | 10/2019 | Hu et al. | |
| 2020/0091063 A1* | 3/2020 | Chen | H01L 25/0657 |
| 2020/0194381 A1 | 6/2020 | Park | |
| 2020/0243450 A1 | 7/2020 | Cho et al. | |
| 2021/0013162 A1 | 1/2021 | Zhang et al. | |
| 2022/0102282 A1 | 3/2022 | Suk et al. | |

FOREIGN PATENT DOCUMENTS

| | | |
|---|---|---|
| JP | 2001274555 A | 10/2001 |
| JP | 4869991 B2 | 2/2012 |
| KR | 10-2020-0069573 A | 6/2020 |

* cited by examiner

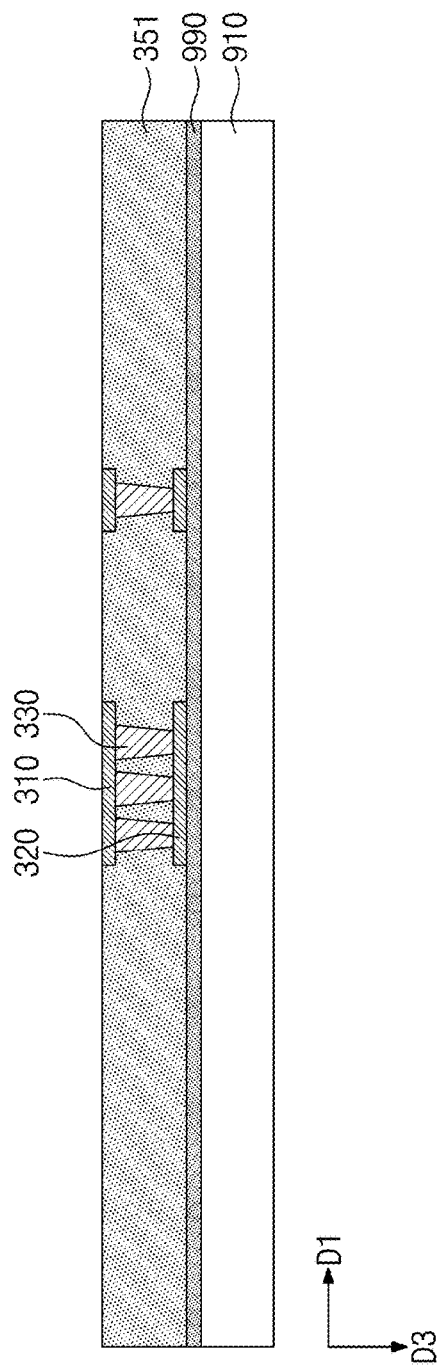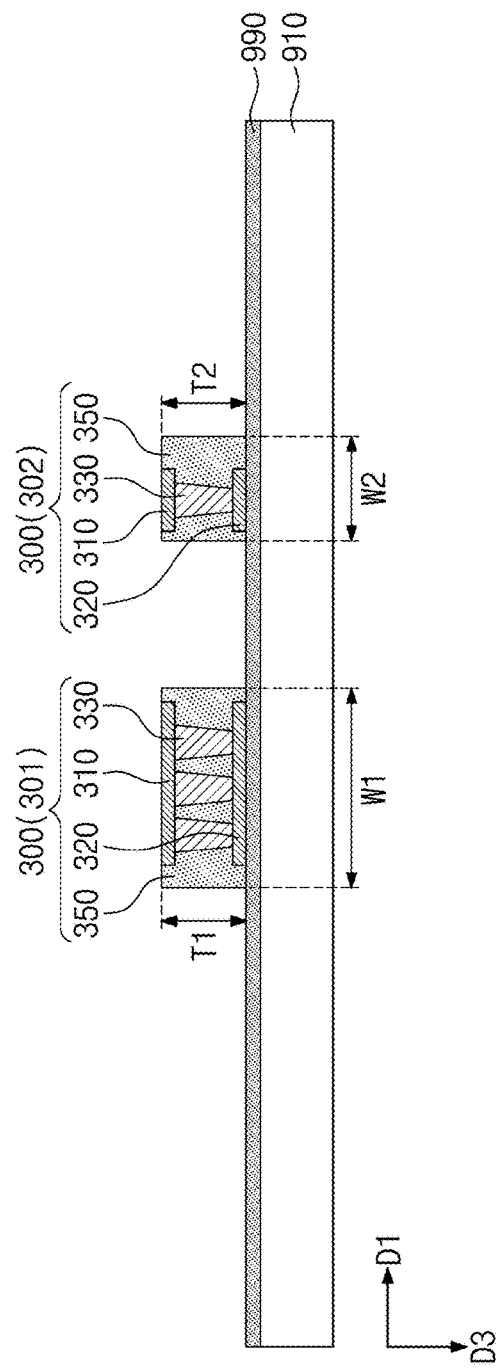

SEMICONDUCTOR PACKAGE WITH REDISTRIBUTION SUBSTRATE HAVING EMBEDDED PASSIVE DEVICE

CROSS-REFERENCE TO RELATED APPLICATION

This application is based on and claims priority from Korean Patent Application No. 10-2020-0153634 filed on Nov. 17, 2020 in the Korean Intellectual Property Office, the disclosure of which is hereby incorporated by reference in its entirety.

BACKGROUND

The present disclosure relate to a semiconductor package, and more particularly, to a semiconductor package including a redistribution substrate and a method of manufacturing the same.

A semiconductor package is provided to implement an integrated circuit chip included in electronic products. A semiconductor package is typically configured to be mounted on a printed circuit board, and bonding wires or bumps are used to electrically connect the semiconductor chip to the printed circuit board. With the development of electronic industry, various studies have been conducted to improve reliability and durability of semiconductor packages.

SUMMARY

Example embodiments in the disclosure provide a semiconductor package in a reduced size with increased reliability, and a method of manufacturing the same.

According to embodiments, there is provided a semiconductor package that may include: a redistribution substrate; at least one passive device in the redistribution substrate the passive device including a first terminal and a second terminal; and a semiconductor chip on a top surface of the redistribution substrate, the semiconductor chip vertically overlapping at least a portion of the passive device, wherein the redistribution substrate includes: a dielectric layer in contact with a first lateral surface, a second lateral surface opposite to the first lateral surface, and a bottom surface of the passive device; a lower conductive pattern on the first terminal; a lower seed pattern provided between the first terminal and the conductive pattern, and directly connected to the first terminal; a first upper conductive pattern on the second terminal and a first upper seed pattern provided between the second terminal and the first upper conductive pattern, and directly connected to the second terminal.

According to embodiments, there is provided a semiconductor package that may include: a redistribution substrate; a capacitor in the redistribution substrate, the capacitor including a base layer, a first terminal, and a second terminal; and a semiconductor chip on a top surface of the redistribution substrate, the semiconductor chip vertically overlapping at least a portion of the capacitor, wherein the redistribution substrate includes: a dielectric layer in contact with lateral surfaces and a bottom surface of the base layer; a redistribution metal pattern in the dielectric layer and laterally spaced apart from the capacitor; and a redistribution seed pattern that covers a top surface of the redistribution metal pattern, wherein a top surface of the redistribution seed pattern is at a level substantially the same as a level of a top surface of the base layer.

According to embodiments, there is provided a semiconductor package that may include: a redistribution substrate; a solder pattern on a bottom surface of the redistribution substrate; a first semiconductor chip on a top surface of the redistribution substrate; a molding layer on the top surface of the redistribution substrate, the molding layer covering the first semiconductor chip; a first capacitor in the redistribution substrate, the first capacitor vertically overlapping the first semiconductor chip; and a second capacitor disposed side by side with the first capacitor in the redistribution substrate, wherein the first capacitor comprises a first base layer a first terminal and a second terminal, wherein the redistribution substrate includes: a dielectric layer in contact with sidewalls of the first base layer and sidewalls of the second capacitor; a lower conductive pattern on the first terminal; a lower seed pattern provided between the first terminal and the lower conductive pattern, and directly connected to the first terminal; an upper conductive pattern on the second terminal; an upper seed pattern provided between the second terminal and the upper conductive pattern and directly connected to the second terminal; a first redistribution pattern in the dielectric layer and laterally spaced apart from the first capacitor and the second capacitor; and a second redistribution pattern between the first redistribution pattern and the solder pattern, wherein a thickness of the second capacitor is substantially the same as a thickness of the first capacitor, and wherein a width of the second capacitor is different from a width of the first capacitor.

BRIEF DESCRIPTION OF DRAWINGS

FIGS. 4A to 4J illustrate cross-sectional views showing a method of fabricating a semiconductor package, according to embodiments.

DETAILED DESCRIPTION OF EMBODIMENTS

Figure 1A:
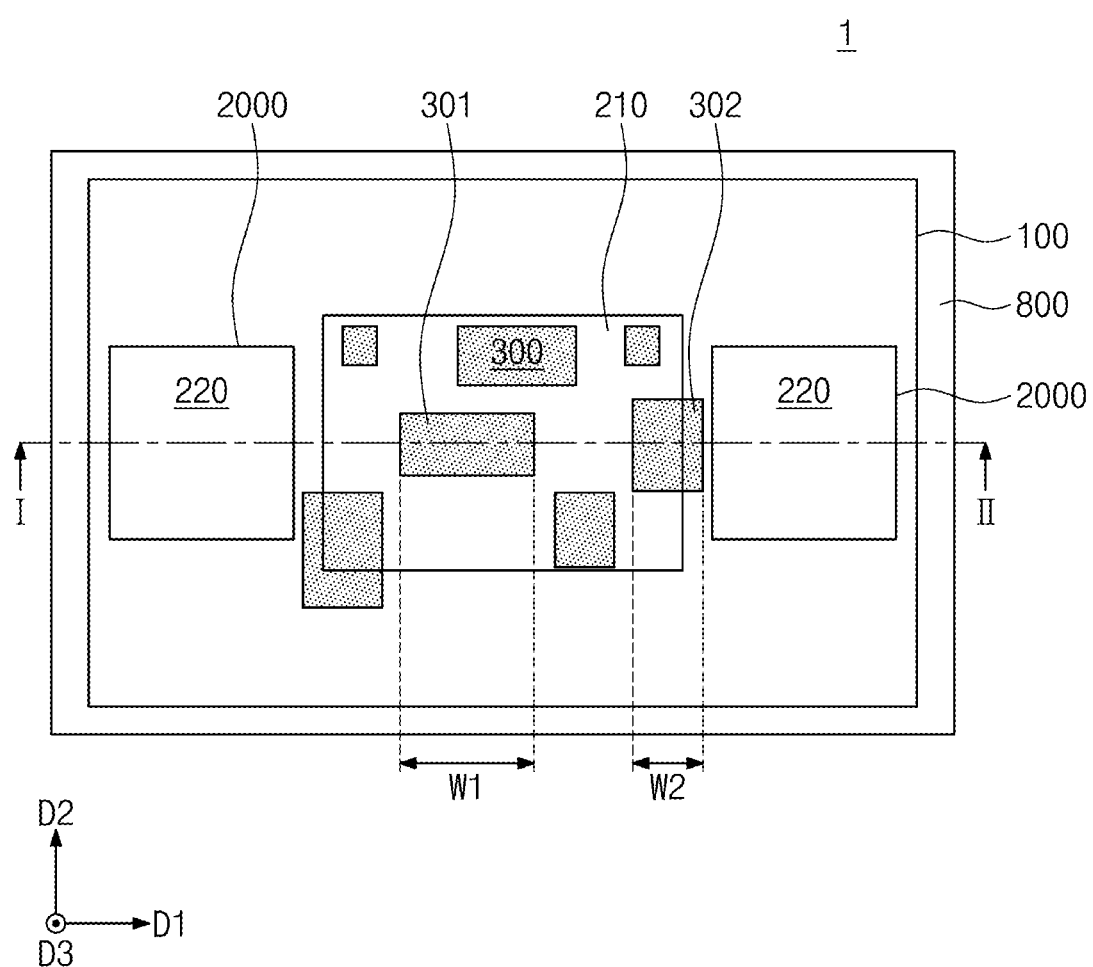
FIG. 1A illustrates a plan view showing a semiconductor package, according to an embodiment.

The embodiments described herein are all example embodiments, and thus, the inventive concept is not limited thereto and may be realized in various other forms.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

Spatially relative terms, such as "over," "above," "on," "upper," "below," "under," "beneath," "lower," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

In this description, like reference numerals may indicate like components. The following will now describe semiconductor packages and their manufacturing methods according to an embodiment.

Figure 1B:
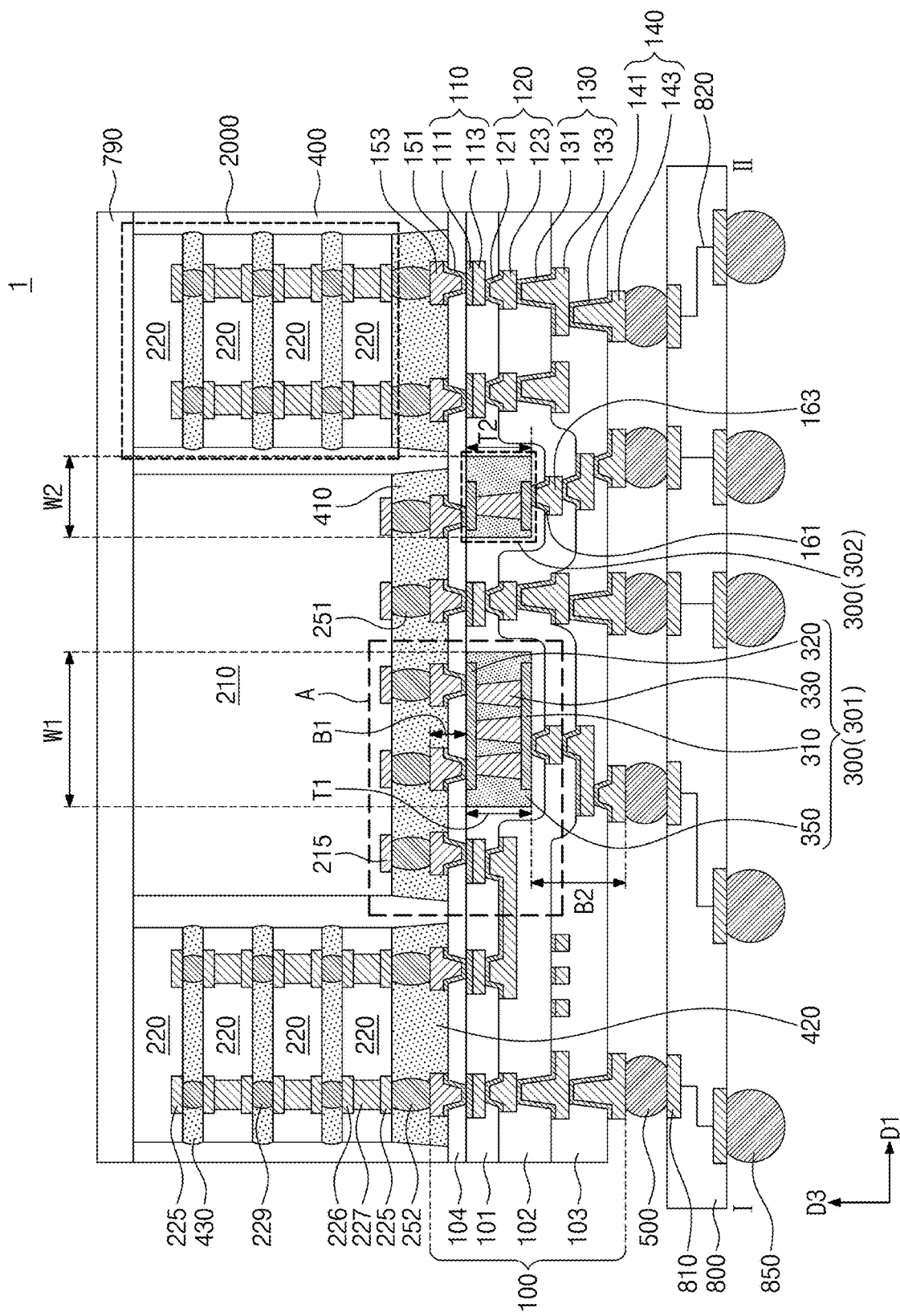
FIG. 1B illustrates a cross-sectional view taken along line I-II of FIG. 1A, according to an embodiment.
Figure 1C:
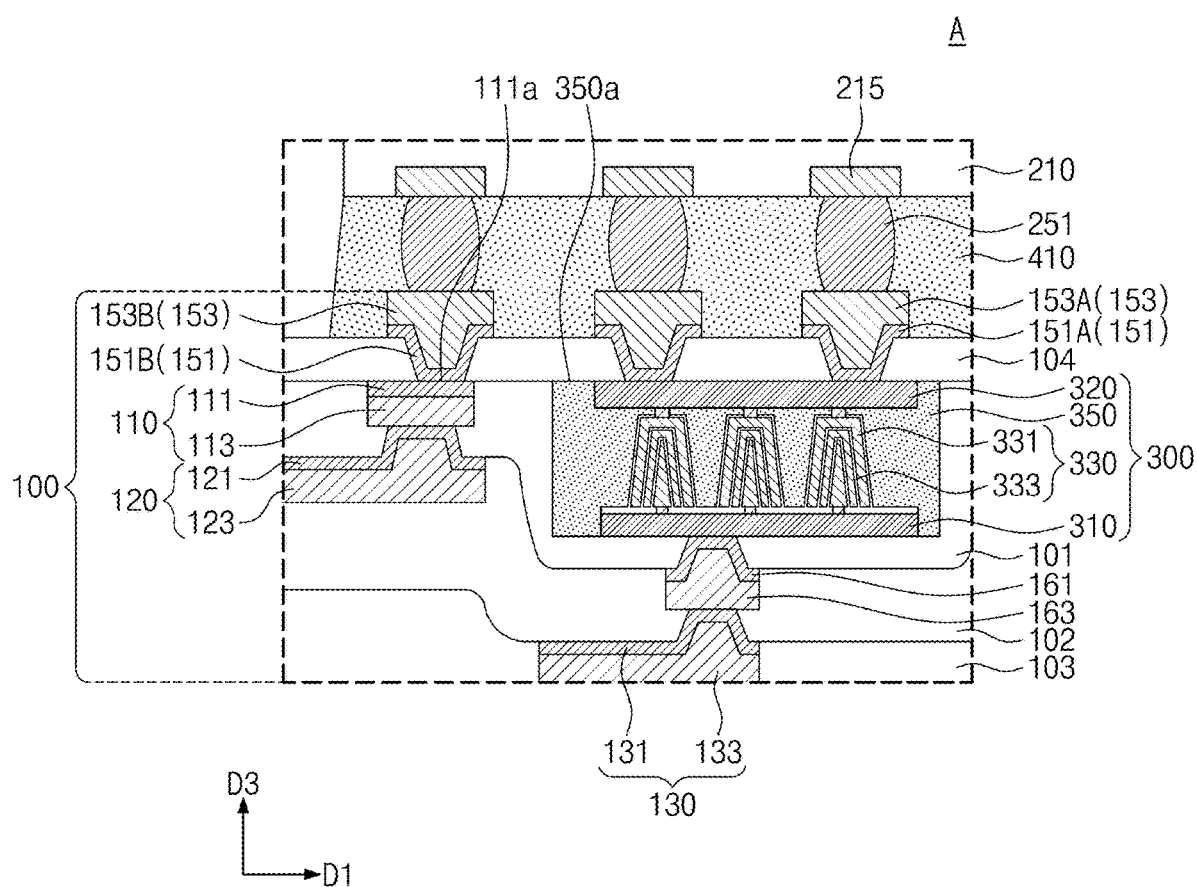
FIG. 1C illustrates an enlarged view showing section A of FIG. 1B, according to an embodiment.

FIG. 1A illustrates a plan view of a semiconductor package according to an embodiment. FIG. 1B illustrates a cross-sectional view taken along line I-II of FIG. 1A, according to an embodiment. FIG. 1C illustrates an enlarged view showing section A of FIG. 1B, according to an embodiment.

Referring to FIGS. 1A to 1C, a semiconductor package 1 may include a package substrate 800, a redistribution substrate 100, solder patterns 500, a first semiconductor chip 210, a chip stack 2000, first bonding bumps 251, second bonding bumps 252, and a molding layer 400.

The package substrate 800 may include a printed circuit board. The package substrate 800 may include metal lines 820 and metal pads 810. The metal lines 820 may be provided in the package substrate 800. The phrase "connected to the package substrate 800" may mean "connected to the metal lines 820." The metal pads 810 may be provided on a top surface of the package substrate 800 and electrically connected to the metal lines 820. External coupling terminals 850 may be provided on a bottom surface of the package substrate 800 and connected to corresponding metal lines 820. External electrical signals may be transmitted through the external coupling terminals 850 to the metal lines 820. Solder balls may be used as the external coupling terminals 850. The external coupling terminals 850 may include metal, such as a solder material. In this description, the solder material may include tin, bismuth, lead, silver, or any alloy thereof.

The redistribution substrate 100 may be disposed on the package substrate 800. The redistribution substrate 100 may serve as an interposer substrate. For example, the redistribution substrate 100 may be disposed between the first semiconductor chip 210 and the package substrate 800 and between the chip stack 2000 and the package substrate 800.

The redistribution substrate 100 may include a dielectric layer, a first redistribution pattern 110, a second redistribution pattern 120, a third redistribution pattern 130, a fourth redistribution pattern 140, a lower seed pattern 161, a lower conductive pattern 163, an upper seed pattern 151, and an upper conductive pattern 153. Here, since a combination of the lower seed pattern 161 and the lower conductive pattern 163 and a combination of the upper seed pattern 151 and an upper conductive pattern 153 are included in the redistribution substrate, each of these combinations may also be referred to as another redistribution pattern. The dielectric layer may include a first dielectric layer 101, a second dielectric layer 102, a third dielectric layer 103, and a fourth dielectric layer 104. Each of the first dielectric layer 101, the second dielectric layer 102, the third dielectric layer 103, and the fourth dielectric layer 104 may include an organic material, such a photosensitive polymer. In this description, the photosensitive polymer may include, for example, at least one selected from photosensitive polyimide, polybenzoxazole, phenolic polymers, and benzocyclobutene polymers. The third dielectric layer 103 may be a lowermost dielectric layer. The second dielectric layer 102, the first dielectric layer 101, and the fourth dielectric layer 104 may be stacked on a top surface of the third dielectric layer 103. For example, the first dielectric layer 101, the second dielectric layer 102, the third dielectric layer 103, and the fourth dielectric layer 104 may include the same material as each other. An indistinct interface may be provided between two adjacent dielectric layers among the first dielectric layer 101, the second dielectric layer 102, the third dielectric layer 103, and the fourth dielectric layer 104. The number of the dielectric layers 101, 102, 103, and 104 may be variously changed.

The first redistribution pattern 110 may be disposed in the first dielectric layer 101. The first redistribution pattern 110 may include a first seed pattern 111 and a first metal pattern 113. The first seed pattern 111 may be disposed in the first dielectric layer 101. The first seed pattern 111 may be a redistribution seed pattern. The first seed pattern 111 may include a seed metallic material, such as copper, titanium, or any alloy thereof. The first seed pattern 111 may be a barrier pattern. For example, the first seed pattern 111 may prevent diffusion of materials included in the first metal pattern 113. The first metal pattern 113 may be disposed on a bottom surface of the first seed pattern 111. The first metal pattern 113 may be a redistribution metal pattern. The first metal pattern 113 may include, for example, copper or an alloy of copper. The first metal pattern 113 may include a material different from that forming the first seed pattern 111.

The second redistribution pattern 120 may be connected to a bottom surface of the first metal pattern 113. The first dielectric layer 101 may have the second redistribution pattern 120 disposed on a bottom surface thereof.

The second redistribution pattern 120 may include a second seed pattern 121 and a second metal pattern 123. The second metal pattern 123 may include a line part and a via part. In this description, a via part of a certain conductive component may be a portion for vertical connection. A line part of a certain conductive component may be a portion of horizontal connection. When a certain component includes a via part and a line part, the line part may have a width greater than that of the via part. The via part of the second metal pattern 123 may be disposed between the first redistribution pattern 110 and the line part of the second metal pattern 123. The line part of the second metal pattern 123 may have a top surface at a level lower than that of a top surface of the via part included in the second metal pattern 123. The via part and the line part of the second metal pattern 123 may include the same material, and may be connected to each other with no boundary therebetween.

The second seed pattern 121 may be disposed on a top surface of the second metal pattern 123. For example, the second seed pattern 121 may be disposed on the top surface and a sidewall of the via part included in the second metal pattern 123, and may also be disposed on the top surface of the line part included in the second metal pattern 123. The second seed pattern 121 may be interposed between the first redistribution pattern 110 and the second metal pattern 123 and between the first dielectric layer 101 and the second metal pattern 123. The second seed pattern 121 may not be disposed on a bottom surface of the second metal pattern 123. The second seed pattern 121 may include a material different from that forming the second metal pattern 123. The second seed pattern 121 may include a seed metallic material the same as or similar to that discussed in the example of the first seed pattern 111.

The second dielectric layer 102 may be disposed on the bottom surface of the first dielectric layer 101, and may cover a lower portion of the second redistribution pattern 120. The second dielectric layer 102 may have an undulation at a bottom surface thereof, not being limited thereto.

The third redistribution pattern 130 may be disposed on a bottom surface of the second redistribution pattern 120 and connected to the second redistribution pattern 120. The second dielectric layer 102 may have the third redistribution pattern 130 provided on the bottom surface thereof.

The third redistribution pattern 130 may include a third seed pattern 131 and a third metal pattern 133. The third metal pattern 133 may include a line part and a via part. The via part of the third metal pattern 133 may be disposed between the second redistribution pattern 120 and the line part of the third metal pattern 133. The third seed pattern 131 may be disposed on a top surface of the third metal pattern 133. The third seed pattern 131 may be interposed between the second redistribution pattern 120 and the third metal pattern 133 and between the second dielectric layer 102 and the third metal pattern 133. The third seed pattern 131 may include a material different from that forming the third metal pattern 133. The third seed pattern 131 may include a seed metallic material the same as or similar to that discussed in the example of the first seed pattern 111.

The third dielectric layer 103 may be disposed on the bottom surface of the second dielectric layer 102, and may cover a lower portion of the third redistribution pattern 130. The third dielectric layer 103 may have a bottom surface that is substantially flat, but the embodiment is not limited thereto.

The fourth redistribution pattern 140 may be disposed on a bottom surface of the third redistribution pattern 130 and connected to the third metal pattern 133. The third dielectric layer 103 may have the fourth redistribution pattern 140 disposed on the bottom surface thereof.

The fourth redistribution pattern 140 may include a fourth seed pattern 141 and a fourth metal pattern 143. The fourth metal pattern 143 may include a line part and a via part. The via part of the fourth metal pattern 143 may be disposed between the third redistribution pattern 130 and the line part of the fourth metal pattern 143. The fourth seed pattern 141 may be interposed between the third redistribution pattern 130 and the fourth metal pattern 143 and between the third dielectric layer 103 and the fourth metal pattern 143. The fourth seed pattern 141 may be disposed on a top surface of the fourth metal pattern 143. The fourth seed pattern 141 may not be disposed on a bottom surface of the fourth metal pattern 143. The fourth redistribution pattern 140 may correspond to a lowermost redistribution pattern.

The fourth redistribution pattern 140 may be provided in plural, and the plurality of fourth redistribution patterns 140 may be disposed side by side with each other. In this description, the phrase "certain components are disposed side by side" may mean "any two neighboring components among the certain components are spaced apart from each other, without the same or similar component therebetween, in a first direction D1 or a second direction D2." The first direction D1 may be parallel to a top surface of the first semiconductor chip 210. The second direction D2 may also be parallel to the top surface of the first semiconductor chip 210 while intersecting the first direction D1.

Although not shown in the drawings, the redistribution substrate 100 may further include a passivation layer. The passivation layer may be disposed on the bottom surface of the third dielectric layer 103, and may also be disposed on lower sidewalls of the fourth redistribution patterns 140. The passivation layer may include a dielectric material.

The solder patterns 500 may be disposed on a bottom surface of the redistribution substrate 100. The solder patterns 500 may be correspondingly disposed on bottom surfaces of the fourth redistribution patterns 140. The solder patterns 500 may be connected to corresponding fourth metal patterns 143 and attached to the bottom surfaces of the fourth metal patterns 143. The fourth redistribution patterns 140 may serve as solder pads. The solder patterns 500 may act as terminals. The solder patterns 500 may have a solder-ball shape and include a solder material.

The first dielectric layer 101 may have, on its top surface, the fourth dielectric layer 104 that is disposed on a top surface of the first redistribution pattern 110 and the top surface of the first dielectric layer 101. An upper bonding pattern may be disposed on the fourth dielectric layer 104. The upper bonding pattern may include an upper seed pattern 151 and an upper conductive pattern 153. The upper conductive pattern 153 may be disposed in and on the fourth dielectric layer 104. The upper conductive pattern 153 may include metal, such as copper. The upper conductive pattern 153 may have a lower portion that serves as a via part. The lower portion of the upper conductive pattern 153 may be disposed in the fourth dielectric layer 104. The upper conductive pattern 153 may have an upper portion that extends onto a top surface of the fourth dielectric layer 104. The upper portion and the lower portion of the upper conductive pattern 153 may be connected to each other with no boundary therebetween. The upper portion of the upper conductive pattern 153 may serve as a pad part or a line part.

The upper seed pattern 151 may be disposed on a bottom surface of the upper conductive pattern 153, and may be disposed between the upper conductive pattern 153 and the fourth dielectric layer 104. The bottom surface of the upper conductive pattern 153 may be located at a level substantially the same as that of a bottom surface of the fourth dielectric layer 104. The upper seed pattern 151 may include a different material from that forming the upper conductive pattern 153. For example, the upper seed pattern 151 may include copper, titanium, or any alloy thereof.

A passive device may be disposed in the redistribution substrate 100. The passive device may be a capacitor 300. In a plan view as shown in FIG. 1A, the capacitor 300 may overlap the first semiconductor chip 210. The capacitor 300 may be provided in plural in the redistribution substrate 100. The plurality of capacitors 300 may be laterally spaced apart from each other. Each of the plurality of capacitors 300 may include a base layer 350, a first terminal 310, a second terminal 320, and a stack structure 330. The base layer 350 may include a dielectric material. For example, the base layer 350 may include a silicon-based dielectric material, such as one or more of tetraethyl orthosilicate, silicon oxide, silicon carbide, and silicon nitride. As illustrated in FIG. 1C, the first terminal 310 may be exposed on a bottom surface of the base layer 350. The bottom surface of the base layer 350 may correspond to a bottom surface of a corresponding capacitor 300. The first terminal 310 may include a conductive material, such as metal and/or doped polysilicon. The second terminal 320 may be disposed and exposed on a top surface 350a of the base layer 350. The second terminal 320 may have a top surface at a level substantially the same as that of the top surface 350a of the base layer 350, but the embodiment is not limited thereto. The second terminal 320 may include a conductive material, such as metal and/or doped polysilicon.

The stack structure 330 may be disposed in the base layer 350. The stack structure 330 may have sidewalls surrounded by the base layer 350. The base layer 350 may be interposed between the stack structure 330 and the redistribution substrate 100. The base layer 350 may separate the stack structure 330 from the first dielectric layer 101. The stack structure 330 may include a plurality of conductive layers 331 and dielectric films 333 between the conductive layers 331. For example, the base layer 350 may have a trench, and the stack structure 330 may be disposed in the trench of the base layer 350. The stack structure 330 may serve as a capacitor unit. One of the capacitors 300 may include a plurality of stack structures 330 or a single stack structure 330. The base layer 350 may act as a dummy pattern or a buffer pattern.

The plurality of capacitors 300 may have their top surfaces at substantially the same level. The capacitors 300 may have their thicknesses that are substantially the same as each other. The thickness of each of the capacitors 300 may correspond to an interval between the top surface 350a and the bottom surface of the base layer 350. For example, the capacitors 300 may include a first capacitor 301 and a second capacitor 302 that are spaced apart from each other. The second capacitor 302 may have a thickness T2 substantially the same as a thickness T1 of the first capacitor 301. The thicknesses of the capacitors 300 may each be about 0.1% to about 50% of a thickness of the redistribution substrate 100. For example, each of the thickness T1 of the first capacitor 301 and the thickness T2 of the second capacitor 302 may be about 0.1% to about 50% of the thickness of the redistribution substrate 100. The thickness of the redistribution substrate 100 may correspond to an interval between a top surface of the upper conductive pattern 153 and the bottom surface of the fourth redistribution pattern 140.

The capacitors 300 may have different widths from each other. The widths of the capacitors 300 may be measured in the first direction D1. For example, the second capacitor 302 may have a width W2 different from a width W1 of the first capacitor 301. The capacitors 300 may have different lengths from each other as shown in FIG. 1A. The lengths of the capacitors 300 may be measured in the second direction D2. The second capacitor 302 may have a length different from that of the first capacitor 301. The second capacitor 302 may have a planar area different from that of the first capacitor 301. For brevity of description, the following will discuss a single capacitor 300.

The capacitor 300 may be directly in contact with the redistribution substrate 100. For example, neither an underfill layer nor an adhesive layer may be provided between the capacitor 300 and the redistribution substrate 100. According to embodiments, the first dielectric layer 101 may be in contact with a first sidewall, a second sidewall, and a bottom surface of the capacitor 300. The second sidewall of the capacitor 300 may be opposite to the first sidewall of the capacitor 300. The first side wall and the second sidewall of the capacitor 300 may correspond to outer sidewalls of the base layer 350. The bottom surface of the capacitor 300 may connect an edge of the first sidewall to an edge of the second sidewall. Therefore, the capacitor 300 may be satisfactorily encapsulated in the first dielectric layer 101. The fourth dielectric layer 104 may cover or may be disposed on the top surface of the capacitor 300. As shown in FIG. 1C, the fourth dielectric layer 104 may be in contact with the top surface of the capacitor 300. The top surface of the capacitor 300 may be opposite to the bottom surface of the capacitor 300. The top surface of the capacitor 300 may include the top surface 350a of the base layer 350. The top surface of the capacitor 300 may further include a top surface of the first terminal 310.

The lower conductive pattern 163 may be disposed on a bottom surface of the first terminal 310. The lower conductive pattern 163 may include metal, such as copper. The lower seed pattern 161 may be interposed between and directly connected to the lower conductive pattern 163 and the first terminal 310. Therefore, the redistribution substrate 100 may become small in size and may exhibit improved reliability. The lower seed pattern 161 may include a different material from that of the lower conductive pattern 163. For example, the lower seed pattern 161 may include a conductive material, such as copper, titanium, or any alloy thereof. The lower seed pattern 161 may include a different material from that of the first terminal 310, but the embodiment is not limited thereto. The lower seed pattern 161 may include no solder material. The lower seed pattern 161 may extend between the first dielectric layer 101 and the lower conductive pattern 163.

The third redistribution pattern 130 may be provided in plural. One of the third redistribution patterns 130 may be disposed on a bottom surface of the lower conductive pattern 163 and electrically connected to the lower conductive pattern 163. Another of the third redistribution patterns 130 may be disposed on the bottom surface of the second redistribution pattern 120, as discussed above, and may be electrically connected to the second redistribution pattern 120.

An external electric signal may be transmitted to the first terminal 310 through the solder pattern 500, the one of the third redistribution patterns 130, and the lower conductive pattern 163. The electric signal may be a voltage signal or a data signal. The first terminal 310 may be an input terminal, but the embodiment is not limited thereto.

Differently from that shown, a plurality of lower conductive patterns 163 and a plurality of lower seed patterns 161 may be disposed on the bottom surface of the first terminal 310, thereby connected to the first terminal 310. The first terminal 310 may be electrically connected through a plurality of lower seed patterns 161 to a plurality of solder patterns 500. The capacitor 300 may receive external electric signals from a plurality of solder patterns 500.

As shown in FIG. 1C, the upper conductive pattern 153 may include a first upper conductive pattern 153A and a second upper conductive pattern 153B. The upper seed pattern 151 may include a first upper seed pattern 151A and a second upper seed pattern 151B.

The first upper conductive pattern 153A may be disposed on the top surface of the second terminal 320. The first upper seed pattern 151A may be interposed between the first upper conductive pattern 153A and the second terminal 320. The first upper seed pattern 151A may be directly connected to a bottom surface of the first upper conductive pattern 153A and the top surface of the second terminal 320. The first upper conductive pattern 153A may be connected through the first upper seed pattern 151A to the second terminal 320. A plurality of first upper conductive patterns 153A may be connected to the second terminal 320 of the first capacitor 301. Therefore, a plurality of first bonding bumps 251 may be electrically connected to the second terminal 320 of the first capacitor 301. As shown in FIG. 1B, a single upper conductive pattern 153 may be connected to the second terminal 320 of the second capacitor 302. In this case, a single first bonding bump 251 may be electrically connected to the second terminal 320 of the second capacitor 302. The second terminal 320 may be an output terminal of the capacitor 300, but the embodiment is not limited thereto.

The first redistribution pattern 110 may be laterally spaced apart from the capacitor 300. For example, the first metal pattern 113 may be laterally spaced apart from the first capacitor 301 and the second capacitor 302. A top surface of the first seed pattern 111 may be located at a level substantially the same as that of the top surface of the capacitor 300. For example, as shown in FIG. 1C, the first seed pattern 111 may have a top surface 111a at a level substantially the same as that of the top surface 350a of the base layer 350. The top surface 111a of the first seed pattern 111 may be located at a level substantially the same as that of the top surface of the second terminal 320. According to an embodiment, the first seed pattern 111 may not be provided.

The second upper conductive pattern 153B may be spaced apart from the first upper conductive pattern 153A. The second upper conductive pattern 153B may not vertically overlap the capacitor 300. The term "vertical" may mean "a third direction D3" or "a direction opposite to the third direction D3." The third direction D3 may be substantially perpendicular to the top surface of the first semiconductor chip 210, and may intersect the first direction D1 and the second direction D2. The second upper conductive pattern 153B may be disposed on the top surface of the first redistribution pattern 110. The second upper seed pattern 151B may be interposed between the second upper conductive pattern 153B and the first redistribution pattern 110, thereby being directly connected to the first redistribution pattern 110. For example, the second upper seed pattern 151B may be directly connected to the first seed pattern 111. The second upper seed pattern 151B may be in contact with the top surface 111a of the first seed pattern 111. According to an embodiment, the first seed pattern 111 may be omitted, and the second upper seed pattern 151B may be directly connected to the first metal pattern 113. Accordingly, the semiconductor package 1 may become small in size. Further, since two redistribution patterns (e.g., the first redistribution pattern 110 and the combination of the upper seed pattern 151 and the upper conductive pattern 153) are vertically coupled or connected to each other as shown in FIG. 1B, one or more seed patterns (e.g., the first seed pattern 111 and the upper seed pattern 151) may be omitted to further reduce the size of the semiconductor package 1.

As shown in FIG. 1B, the first semiconductor chip 210 may be mounted on a top surface of the redistribution substrate 100. In a plan view, the first semiconductor chip 210 may be disposed on a central region of the redistribution substrate 100. The first semiconductor chip 210 may include integrated circuits (not shown) and chip pads 215. The integrated circuits may be provided in the first semiconductor chip 210. The chip pads 215 may be disposed on a bottom surface of the first semiconductor chip 210 and electrically connected to the integrated circuits. The phrase "a certain component is connected to the chip pad 215" may mean that "the certain component is connected to the first semiconductor chip 210." The first bonding bumps 251 may be provided between and connected to a plurality of upper conductive pattern 153 and the chip pads 215 of the first semiconductor chip 210. Therefore, the first semiconductor chip 210 may be electrically connected through the first bonding bumps 251 to the second semiconductor chip 220, the capacitors 300, and the solder patterns 500. Although not shown in the drawings, additional conductive patterns (not shown) may further be interposed between the first bonding bumps 251 and the upper conductive patterns 153. Each of the first bonding bumps 251 may include a solder, a pillar, or a combination thereof. The first bonding bumps 251 may include a conductive material, such as copper or a solder material. The first bonding bumps 251 may have therebetween a pitch less than that of the solder patterns 500 and that of the external coupling terminals 850.

According to embodiments, because the capacitor 300 is disposed in the redistribution substrate 100, an electrical path may be reduced between the capacitor 300 and the first semiconductor chip 210. For example, an interval B1 between the top surface of the capacitor 300 and the top surface of the redistribution substrate 100 may be less than an interval B2 between the bottom surface of the capacitor 300 and the bottom surface of the redistribution substrate 100. Therefore, the electrical path between the capacitor 300 and the first semiconductor chip 210 may be additionally reduced to increase electrical characteristics of the semiconductor package 1. For example, the semiconductor package 1 may exhibit improved power integrity properties. The interval B1 between the top surface of the capacitor 300 and the top surface of the redistribution substrate 100 may correspond to a difference in level between the top surface of the upper conductive pattern 153 and the top surface of the capacitor 300. The interval B2 between the bottom surface of the capacitor 300 and the bottom surface of the redistribution substrate 100 may correspond to an interval between the bottom surface of the capacitor 300 and the bottom surface of the fourth redistribution pattern 140. In this description, the language "level" may indicate "vertical level", and the expression "difference in level" may be measured in a direction parallel to the third direction D3.

The chip stack 2000 may be mounted on the top surface of the redistribution substrate 100. The chip stack 2000 may be laterally spaced apart from the first semiconductor chip 210. The chip stack 2000 may include a plurality of stacked second semiconductor chips 220. The second semiconductor chips 220 may each include integrated circuits (not shown) therein. The second semiconductor chips 220 may be disposed on the top surface at an edge region of the redistribution substrate 100. In a plan view, the edge region of the redistribution substrate 100 may be provided between a lateral surface and the central region of the redistribution substrate 100. The edge region may surround the central region of the redistribution substrate 100.

The second semiconductor chips 220 may be of a type different from the first semiconductor chip 210. For example, the first semiconductor chip 210 may be one of a logic chip, a buffer chip, and a system-on-chip (SOC). A lowermost second semiconductor chip 220 may be a logic chip, and the other second semiconductor chips 220 may be memory chips. The memory chip may include a high bandwidth memory (HBM) chip. The lowermost second semiconductor chip 220 may be a logic chip whose type is different from that of the first semiconductor chip 210. For example, the lowermost second semiconductor chip 220 may be a controller chip, and the first semiconductor chip 210 may include an application specific integrated circuit (ASIC) chip or an application processor (AP) chip. The ASIC chip may include an application specific integrated circuit (ASIC). According to an embodiment, the lowermost second semiconductor chip 220 may be a memory chip.

Each of the second semiconductor chips 220 may include a lower pad 225, a through electrode 227, and an upper pad 226. The lower pad 225 and the upper pad 226 may be respectively provided on a bottom surface and a top surface of the second semiconductor chip 220. One or more of the lower pad 225 and the upper pad 226 may be electrically connected to integrated circuits of the second semiconductor chip 220. The through electrode 227 may be disposed in the second semiconductor chip 220, and may be connected to the lower pad 225 and the upper pad 226. An uppermost second semiconductor chip 220 may include the lower pad 225, but may not include the through electrode 227 or the upper pad 226. Differently from that shown, the uppermost second semiconductor chip 220 may further include the through electrode 227 and the upper pad 226. An interposer bump 229 may be interposed between two vertically neighboring second semiconductor chips 220, and may be connected to the lower pad 225 of an upper second semiconductor chip 220 thereof and the upper pad 226 of a lower second semiconductor chip 220 thereof. Therefore, a plurality of second semiconductor chips 220 may be electrically connected to one another. The interposer bump 229 may include a solder, a pillar, or a combination thereof. The interposer bump 229 may include metal or a solder material, but the embodiment is not limited thereto.

According to an embodiment, the interposer bump 229 may be omitted. In this case, the lower pad 225 of the upper second semiconductor chip 220 thereof may be directly bonded to the upper pad 226 of the lower second semiconductor chip 220 thereof.

The second bonding bumps 252 may be interposed between the lowermost second semiconductor chip 220 and the redistribution substrate 100, and may be connected to corresponding lower pads 225 and corresponding upper conductive patterns 153. Therefore, the second semiconductor chips 220 may be electrically connected through the redistribution substrate 100 to the first semiconductor chip 210 and the solder patterns 500. In this description, the phrase "electrically connected to the redistribution substrate 100" may mean "electrically connected to one or more of the upper conductive pattern 153 and the first redistribution pattern 110, the second redistribution pattern 120, the third redistribution pattern 130, and the fourth redistribution pattern 140. The second bonding bumps 252 may have therebetween a pitch less than that of the solder patterns 500 and that of the external coupling terminals 850. The second bonding bumps 252 may include a solder, a pillar, or a combination thereof. The second bonding bumps 252 may include metal or a solder material, but the embodiment is not limited thereto.

The chip stack 2000 may be provided in plural. The plurality of chip stacks 2000 may be laterally spaced apart from each other. The first semiconductor chip 210 may be disposed between the chip stacks 2000. Therefore, an electrical path may be reduced between the first semiconductor chip 210 and the chip stacks 2000.

The semiconductor package 1 may further include a first under-fill layer 410 and second under-fill layer 420. A first under-fill layer 410 may be provided in a first gap between the redistribution substrate 100 and the first semiconductor chip 210, thereby encapsulating the first bonding bump 251. The first under-fill layer 410 may include a dielectric polymer, such as an epoxy-based polymer. The second under-fill layers 420 may correspondingly be provided in second gaps between the redistribution substrate 100 and the chip stacks 2000, thereby encapsulating corresponding second bonding bumps 252. The second under-fill layers 420 may include a dielectric polymer, such as an epoxy-based polymer. Differently from that shown, the second under-fill layers 420 may be omitted, and in this case, the first under-fill layer 410 may further extend into the second gaps, thereby encapsulating the first bonding bumps 251 and the second bonding bumps 252. A third under-fill layer 430 may further be provided in a third gap between the second semiconductor chips 220, thereby encapsulating a plurality of interposer bumps 229. The third under-fill layer 430 may include a dielectric polymer, such as an epoxy-based polymer.

The molding layer 400 may be disposed on the redistribution substrate 100, and may also be disposed on a sidewall of the first semiconductor chip 210 and sidewalls of the second semiconductor chips 220. The molding layer 400 may expose the top surface of the first semiconductor chip 210 and a top surface of the uppermost second semiconductor chip 220. Differently from that shown, the molding layer 400 may also be disposed on the top surface of the first semiconductor chip 210 and the top surface of the uppermost second semiconductor chip 220. According to an embodiment, the first and second under-fill layers 410 and 420 may be omitted, and the molding layer 400 may extend into the first and second gaps.

The semiconductor package 1 may further include a conductive plate 790. The conductive plate 790 may be disposed on the top surface of the first semiconductor chip 210, a top surface of the chip stack 2000, and a top surface of the molding layer 400. The conductive plate 790 may further extend onto a sidewall of the molding layer 400. The conductive plate 790 may protect the first semiconductor chip 210 and the chip stack 2000 against external environment. For example, the conductive plate 790 may absorb external physical impact. The conductive plate 790 may include a material whose thermal conductivity is high, and may serve as a heat sink or a heat slug. For example, when the semiconductor package 1 operates, the conductive plate 790 may promptly externally discharge heat generated from the redistribution substrate 100, the first semiconductor chip 210, and/or the second semiconductor chips 220. The conductive plate 790 may have electrical conductivity and serve as an electromagnetic field shield layer. For example, the conductive plate 790 may shield electromagnetic interference (EMI) between the first semiconductor chip 210 and the second semiconductor chips 220. In this case, the conductive plate 790 may be electrically grounded through the redistribution substrate 100, and may prevent the first semiconductor chip 210 and/or the second semiconductor chips 220 from being electrically damaged caused by electrostatic discharge (ESD).

Although not shown in the drawings, a third semiconductor chip may further be mounted on the redistribution substrate 100. The third semiconductor chip may be of a type different from the first and second semiconductor chips 210 and 220. Differently from that shown, the molding layer 400 may be omitted.

The number of stacked redistribution patterns 110, 120, 130, and 140 may be variously changed. For example, one or more of the second redistribution pattern 120 and the third redistribution pattern 130 may be omitted. According to an embodiment, a fifth redistribution pattern (not shown) may further be interposed between the third redistribution pattern 130 and the fourth redistribution pattern 140.

Figure 1D:
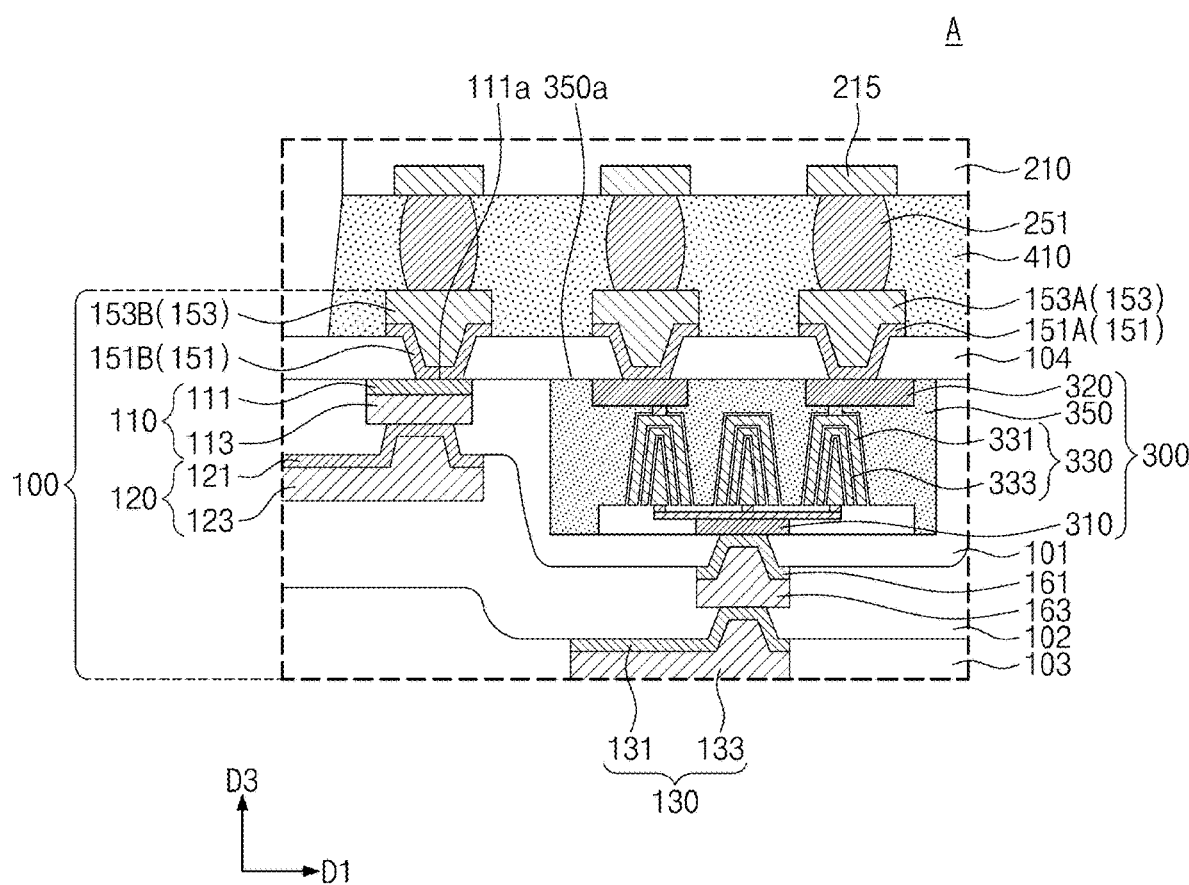
FIG. 1D illustrates a cross-sectional view showing a connection relationship between a capacitor and a redistribution substrate, according to an embodiment.

FIG. 1D illustrates an enlarged cross-sectional view of section A depicted in FIG. 1B, showing a connection relationship between a capacitor and a redistribution substrate according to an embodiment. FIG. 1B will be also referred in explaining FIG. 1D below.

Referring to FIG. 1D, the capacitor 300 may include a base layer 350, a stack structure 330, a first terminal 310, and a plurality of second terminals 320. The second terminals 320 may be laterally spaced apart from each other. A plurality of first upper seed patterns 151A may be directly connected to corresponding second terminals 320. The second terminals 320 may be electrically connected through the first upper seed patterns 151A to corresponding chip pads 215 of the first semiconductor chip 210.

The first terminal 310 may be disposed on a bottom surface of the base layer 350. The first terminal 310 may not vertically overlap the second terminal 320. Differently from that shown, the first capacitor 301 may include a plurality of first terminals 310, and the plurality of first terminals 310 may be connected to corresponding solder patterns (see 500 of FIG. 1B).

Figure 2A:
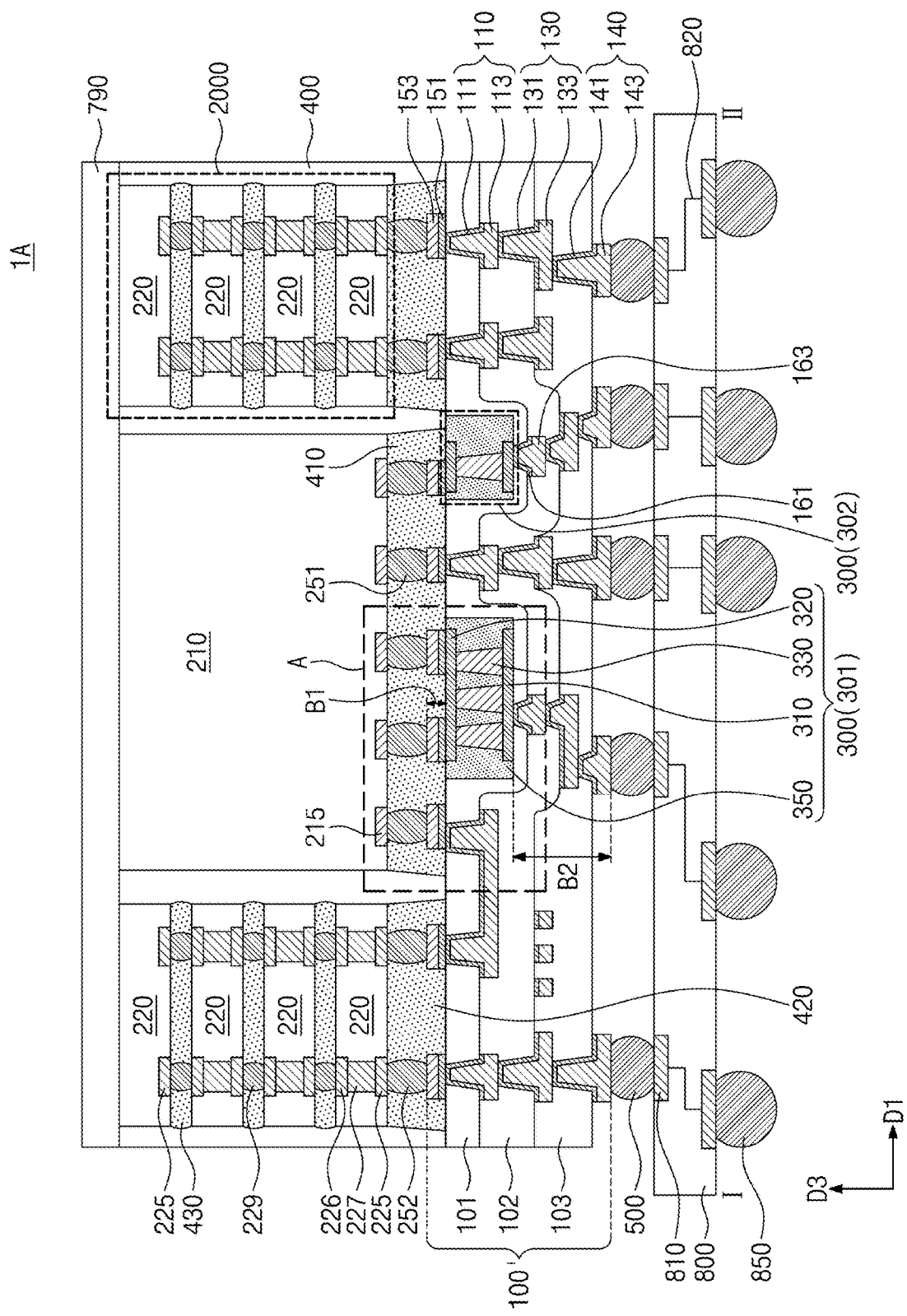
FIG. 2A illustrates a cross-sectional view showing a semiconductor package, according to an embodiments.
Figure 2B:
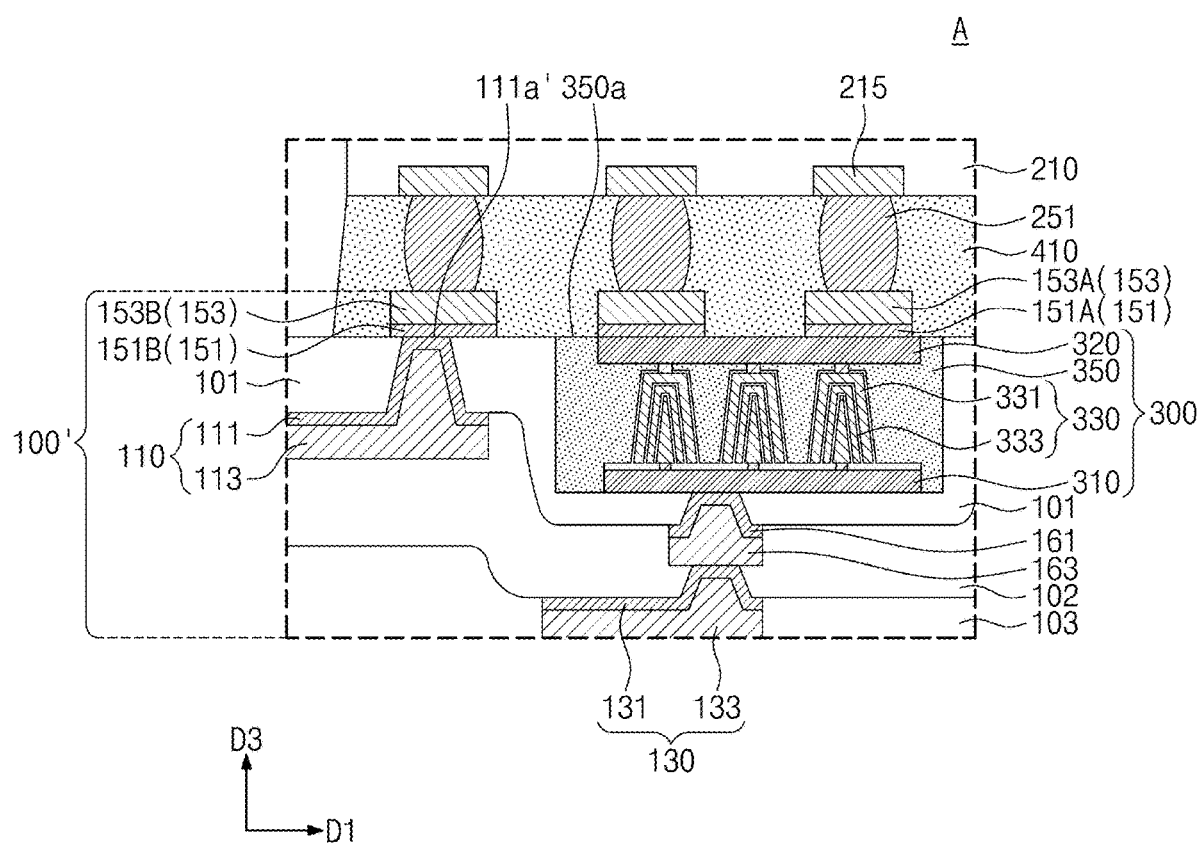
FIG. 2B illustrates an enlarged view showing section A of FIG. 2A, according to an embodiment.

FIG. 2A illustrates a cross-sectional view taken along line I-II of FIG. 1A, showing a semiconductor package, according to an embodiment. FIG. 2B illustrates an enlarged view showing section A of FIG. 2A, according to an embodiment.

Referring to FIGS. 2A and 2B, a semiconductor package 1A may include a package substrate 800, a redistribution substrate 100', a capacitor 300, solder patterns 500, a first semiconductor chip 210, a chip stack 2000, first bonding bumps 251, second bonding bumps 252, and a molding layer 400.

The redistribution substrate 100' may include a first dielectric layer 101, a second dielectric layer 102, a third dielectric layer 103, and a fourth dielectric layer 104, a first redistribution pattern 110, a third redistribution pattern 130, a fourth redistribution pattern 140, a lower seed pattern 161, a lower conductive pattern 163, an upper seed pattern 151, and an upper conductive pattern 153. The first redistribution pattern 110, the third redistribution pattern 130, the fourth redistribution pattern 140, the lower seed pattern 161, the lower conductive pattern 163, the upper seed pattern 151, and the upper conductive pattern 153 may be substantially the same as those discussed in the examples of FIGS. 1A to 1C. In contrast, the redistribution substrate 100' may not include the second redistribution pattern 120 discussed in the examples of FIGS. 1A to 1C. The first dielectric layer 101 may have the first redistribution pattern 110 disposed on a bottom surface thereof. The first redistribution pattern 110 may include a first metal pattern 113 and a first seed pattern 111. The first metal pattern 113 may include a line part and a via part. The via part of the first metal pattern 113 may be provided on the line part of the first metal pattern 113, and may have a width less than that of the line part of the first metal pattern 113.

The first seed pattern 111 may be disposed on the first metal pattern 113. The first seed pattern 111 may have a first top surface 111a'. The first top surface 111a' of the first seed pattern 111 may be provided on a top surface of the via part of the first metal pattern 113. The first top surface 111a' of the first seed pattern 111 may be located at a level substantially the same as that of the top surface 350a of the base layer 350. The first seed pattern 111 may be interposed between the first metal pattern 113 and the second upper seed pattern 151B, thereby being directly connected to the second upper seed pattern 151B. The first seed pattern 111 may further have a second top surface. The second top surface may be disposed on a top surface of the line part of the first metal pattern 113. The second top surface of the first seed pattern 111 may be located at a level lower than that of the first top surface 111a' of the first seed pattern 111. The first seed pattern 111 may be further disposed on a sidewall of the via part of the first metal pattern 113.

Figure 3:
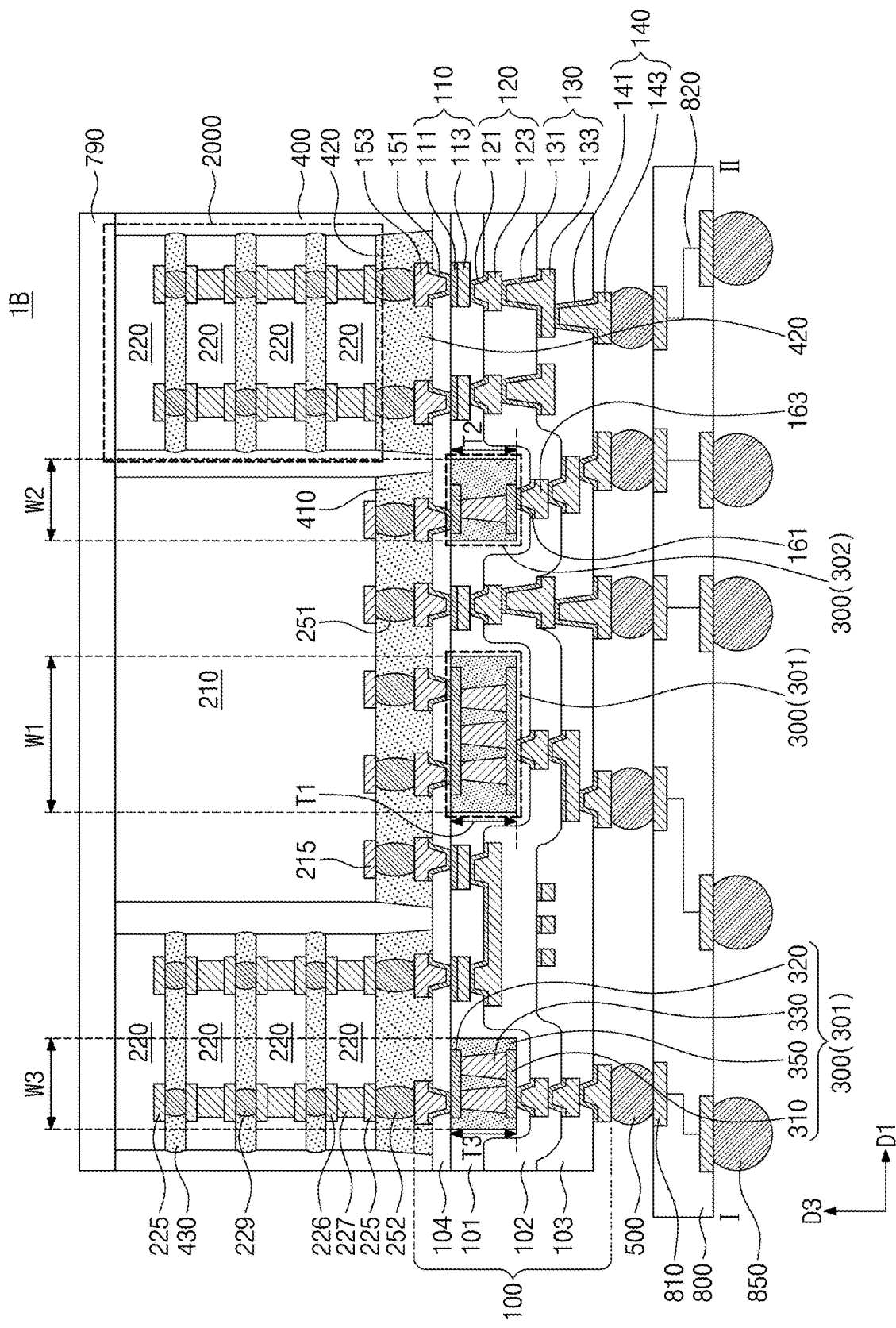
FIG. 3 illustrates a cross-sectional view showing a semiconductor package, according to an embodiment.

FIG. 3 illustrates a cross-sectional view taken along line I-II' of FIG. 1A, showing a semiconductor package, according to an embodiment.

Referring to FIG. 3, a semiconductor package 1B may include a package substrate 800, a redistribution substrate 100, a plurality of capacitors 300, solder patterns 500, a first semiconductor chip 210, a chip stack 2000, first bonding bumps 251, second bonding bumps 252, and a molding layer 400.

The capacitors 300 may include a first capacitor 301, a second capacitor 302, and a third capacitor 303. Each of the capacitors 300 may include a base layer 350, a stack structure 330, a first terminal 310, and a second terminal 320. The first capacitor 301 and the second capacitor 302 may be substantially the same as those discussed in the examples of FIGS. 1A to 1C.

The third capacitor 303 may be provided in the redistribution substrate 100, and may vertically overlap the chip stack 2000. For example, the third capacitor 303 may vertically overlap at least one second semiconductor chip 220. The third capacitor 303 may be directly in contact with the first dielectric layer 101. For example, the base layer 350 of the third capacitor 303 may have opposite sidewalls and a bottom surface that are directly in contact with the first dielectric layer 101. The first terminal 310 of the third capacitor 303 may be directly connected to the lower seed pattern 161. The second terminal 320 of the third capacitor 303 may be directly in contact with the upper seed pattern 151.

The third capacitor 303 may have a thickness T3 substantially the same as a thickness T1 of the first capacitor 301 and a thickness T2 of the second capacitor 302. The third capacitor 303 may have a top surface at a level substantially the same as that of a top surface of the first capacitor 301 and that of a top surface of the second capacitor 302. The third capacitor 303 may have a width W3 different from a width W1 of the first capacitor 301. The width W3 of the third capacitor 303 may be different from a width W2 of the second capacitor 302.

FIGS. 4A to 4J illustrate cross-sectional views showing a method of fabricating a semiconductor package, according to embodiments. For brevity of description, top and bottom surfaces of a certain component will be discussed based on their related drawing in describing FIGS. 4A to 4F. A duplicate description will be omitted below.

Referring to FIG. 4A, a first carrier substrate 910 may be provided. The first carrier substrate 910 may be a semiconductor wafer. The semiconductor wafer may include a crystalline semiconductor material. For example, the semiconductor wafer may include silicon, germanium, or a combination thereof.

An etch stop layer 990 may be formed on the first carrier substrate 910. The etch stop layer 990 may include a silicon-based material. For example, the etch stop layer 990 may include silicon oxide, silicon nitride, silicon oxynitride, or any combination thereof.

First terminals 310, a preliminary base layer 351, stack structures 330, and second terminals 320 may be formed on the etch stop layer 990. The second terminals 320 may be formed on one surface of the etch stop layer 990. The second terminals 320 may be in contact with the one surface of the etch stop layer 990. The second terminals 320 may be laterally spaced apart from each other. The second terminals 320 may be in contact with one surface of the etch stop layer 990. The preliminary base layer 351 may be formed on the etch stop layer 990 and the second terminals 320. The preliminary base layer 351 may be disposed on one surface of the etch stop layer 990, top surfaces of the second terminals 320, and sidewalls of the second terminals 320. The preliminary base layer 351 may include a silicon-based dielectric material.

The stack structures 330 may be formed in the preliminary base layer 351 and may be connected to the second terminals 320. The formation of the stack structures 330 may include forming a trench in the preliminary base layer 351, and forming a dielectric layer and a conductive layer in the trench. The formation of the dielectric and conductive layers may be repeatedly performed. Therefore, the stack structure 330 may include a plurality of conductive layers and a plurality of dielectric layers disposed between corresponding conductive layers. The first terminals 310 may be formed on the stack structures 330. The first terminals 310 may be laterally spaced apart from each other.

Referring to FIG. 4B, the preliminary base layer 351 may undergo an etching process to form capacitors 300. The etching process may partially remove the preliminary base layer 351 to form base layers 350. The base layers 350 may be laterally spaced apart from each other, and may expose the etch stop layer 990. Each of the capacitors 300 may include a corresponding one of the first terminals 310, a corresponding one of the base layers 350, a corresponding at least one of the stack structures 330, and a corresponding one of the second terminals 320. Each of the stack structures 330 may be provided in a corresponding one of the base layers 350. For example, the stack structure 330 may have a sidewall that is covered with the base layer 350 and is not exposed to the outside. The capacitors 300 may be laterally spaced apart from each other.

The capacitors 300 may be formed substantially at the same time in a single process. Therefore, the capacitors 300 may have the same thickness. For example, the capacitors 300 may include a first capacitor 301 and a second capacitor 302, and the second capacitor 302 may have a thickness T2 substantially the same as a thickness T1 of the first capacitor 301. The second capacitor 302 may have a width different from that of the first capacitor 301. According to an embodiment, the second capacitor 302 may have the same width as that of the first capacitor 301.

Figure 4C:
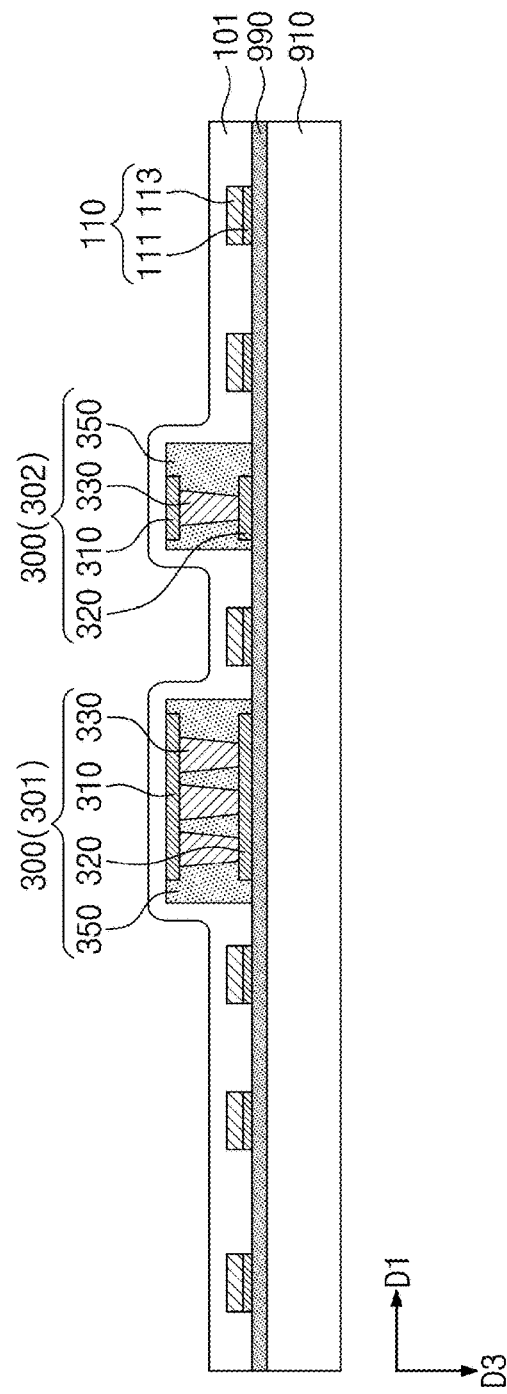

Referring to FIG. 4C, a first redistribution pattern 110 may be formed on an exposed surface of the etch stop layer 990. The formation of the first redistribution pattern 110 may include forming a first seed pattern 111 and forming a first metal pattern 113 on the first seed pattern 111. The first seed pattern 111 may be in contact with one surface of the etch stop layer 990. The formation of the first metal pattern 113 may include performing an electroplating process in which the first seed pattern 111 is used as an electrode. The first redistribution pattern 110 may be laterally spaced apart from the capacitors 300.

A first dielectric layer 101 may be formed on the first redistribution pattern 110 to be also disposed on one surface of the etch stop layer 990, a top surface and sidewalls of the first redistribution pattern 110, and top surfaces and sidewalls of the capacitors 300. The formation of the first dielectric layer 101 may include coating a photosensitive polymer. The first dielectric layer 101 may have undulation on a top surface thereof.

Figure 4D:
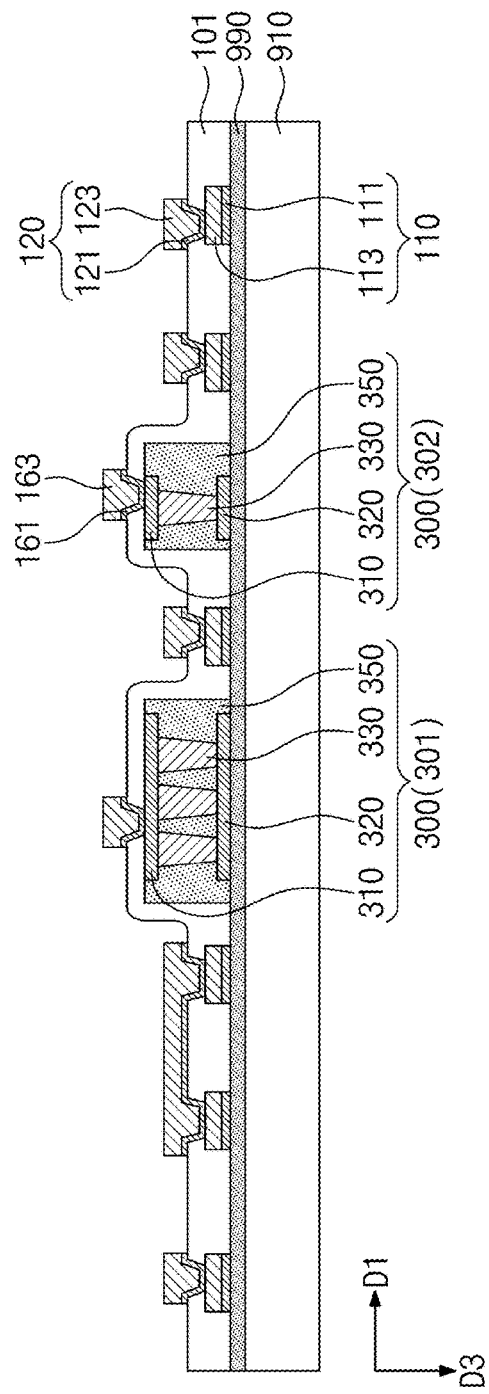

Referring to FIG. 4D, a second redistribution pattern 120, a lower seed pattern 161, and a lower conductive pattern 163 may be formed in the first dielectric layer 101 and on a top surface of the first dielectric layer 101. The formation of the second redistribution pattern 120, the lower seed pattern 161, and the lower conductive pattern 163 may include forming openings in the first direction layer 101, forming a seed layer in the openings and on the top surface of the first dielectric layer 101, forming on the seed layer a resist pattern that has guide openings, performing an electroplating process in which the seed layer is used as an electrode, removing a portion of the resist pattern to expose a portion of the seed layer, and etching the exposed portion of the seed layer. The openings may expose the first terminal 310 or the first redistribution pattern 110. The guide openings may be spatially connected to corresponding openings. The electroplating process may form a lower conductive pattern 163 and a second metal pattern 123 in the openings. The lower conductive pattern 163 and the second metal pattern 123 may fill a lower portion of their corresponding guide opening. The lower conductive pattern 163 may include the same material as that of the second metal pattern 123. The etching of the seed layer may form a second seed pattern 121 and a lower seed pattern 161. The lower seed pattern 161 may be disposed on one of the capacitors 300, and may be directly connected to the first terminal 310.

The second seed pattern 121 may be spaced and electrically separated from the lower seed pattern 161. The second seed pattern 121 and the lower seed pattern 161 may be formed in a single process. The second seed pattern 121 may have the same thickness as that of the lower seed pattern 161, and may include the same material as that of the lower seed pattern 161.

Figure 4E:
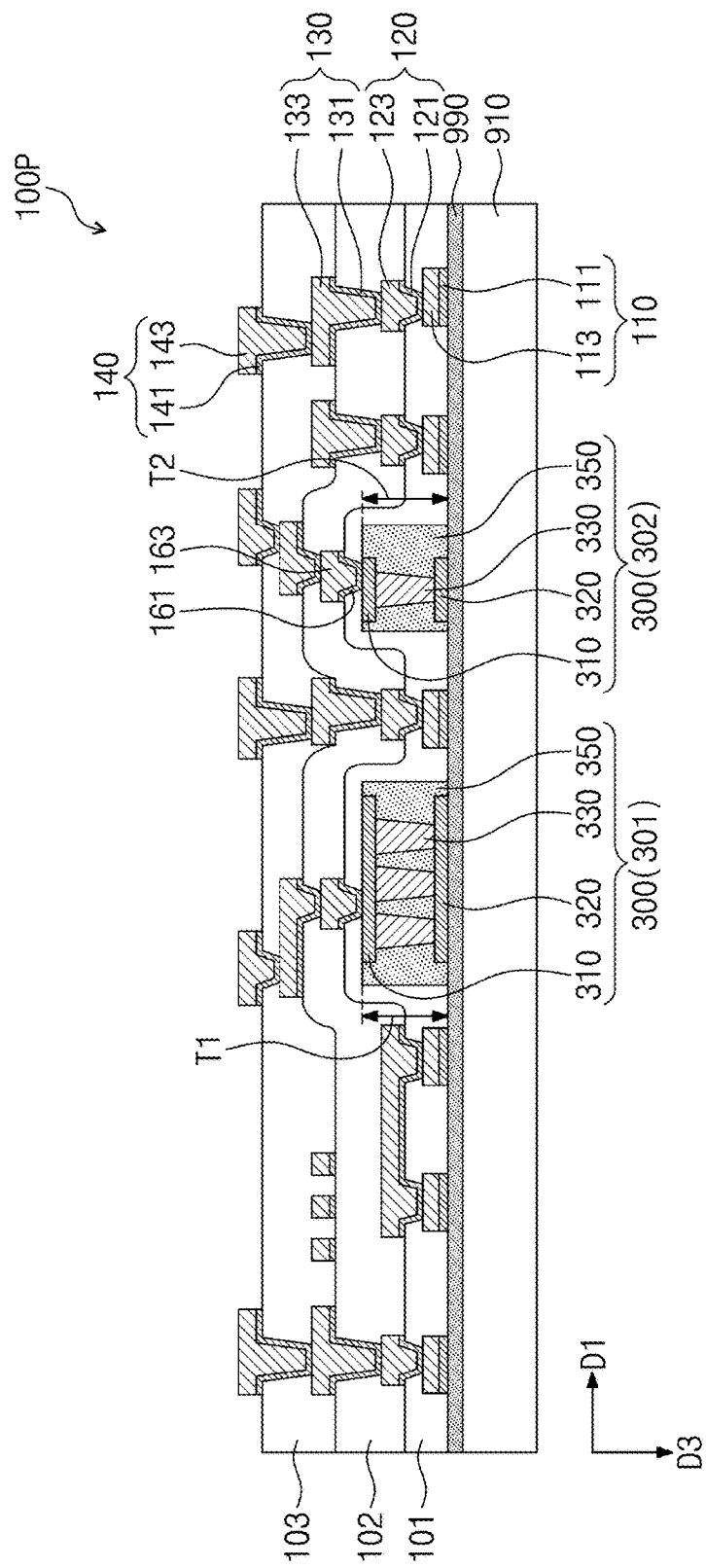

Referring to FIG. 4E, a second dielectric layer 102, a third redistribution pattern 130, a third dielectric layer 103, and a fourth redistribution pattern 140 may be formed above one surface of the first carrier substrate 910. The second dielectric layer 102 may be formed on the second redistribution pattern 120 and the top surface of the first dielectric layer 101. The second dielectric layer 102 may be formed by the same method used for forming the first dielectric layer 101. The third redistribution pattern 130 may be formed in the second dielectric layer 102 and on a top surface of the second dielectric layer 102. The third redistribution pattern 130 may include a plurality of third redistribution patterns 130. At least one of the third redistribution patterns 130 may be connected to the second redistribution pattern 120. Another at least one of the third redistribution patterns 130 may be connected to the lower conductive pattern 163. The third redistribution pattern 130 may be formed by substantially the same method used for forming the second redistribution pattern 120. The third dielectric layer 103 may be formed on the second dielectric layer 102 and the third redistribution pattern 130.

Figure 4F:
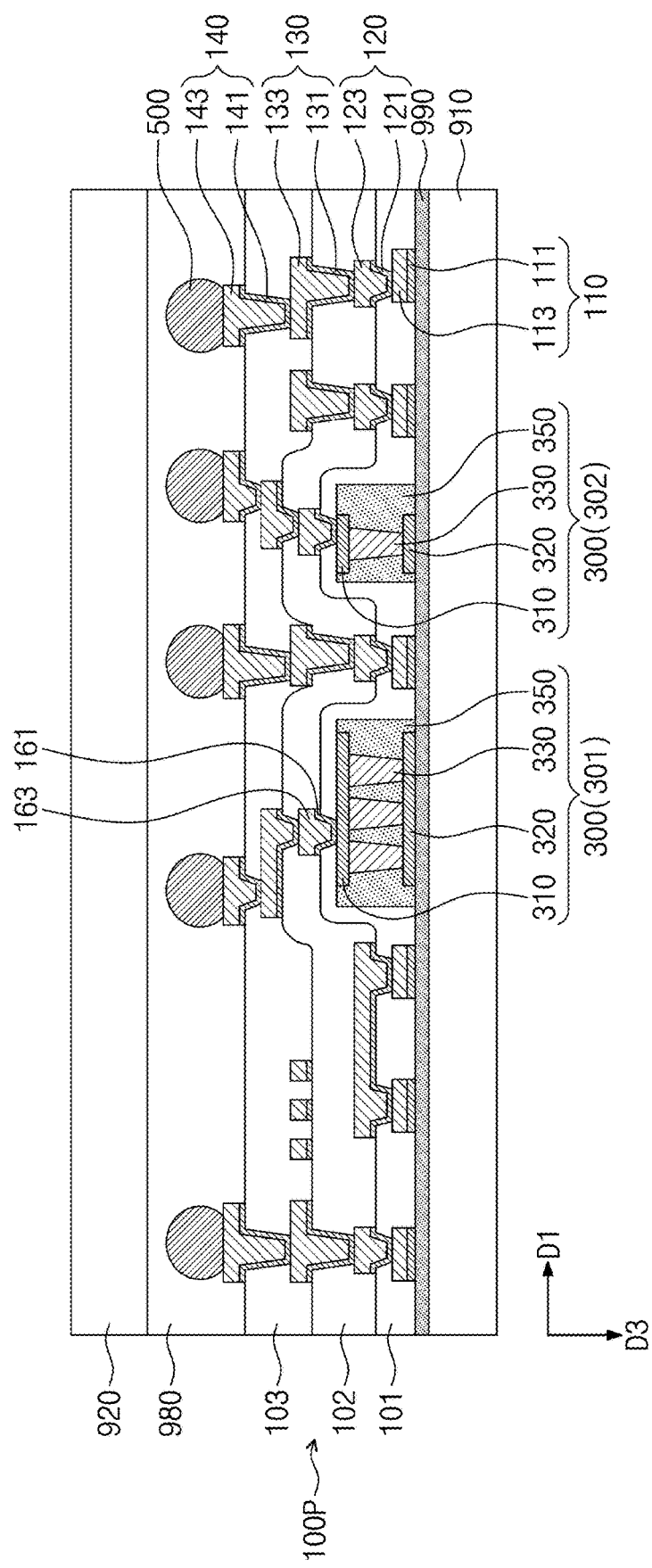
Figure 4G:
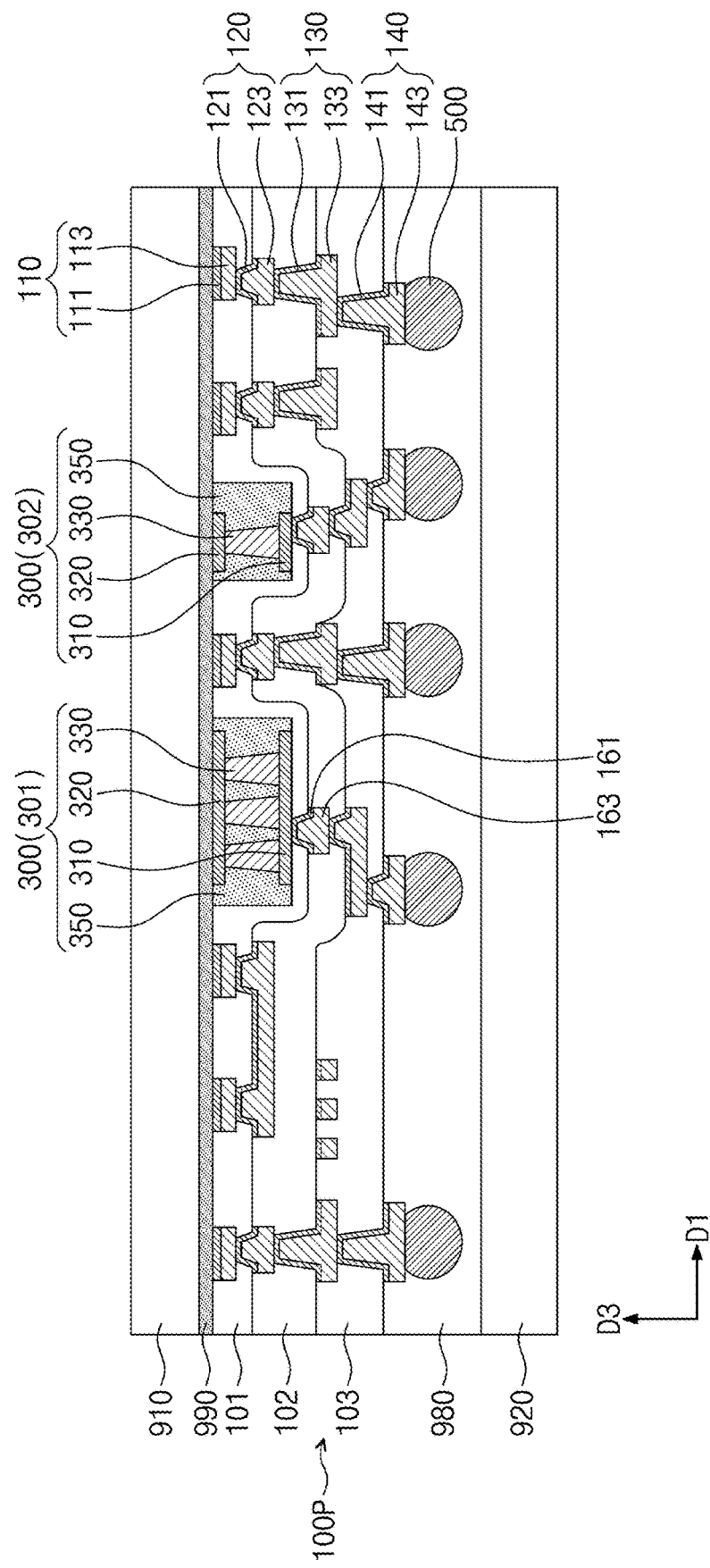
Figure 4H:
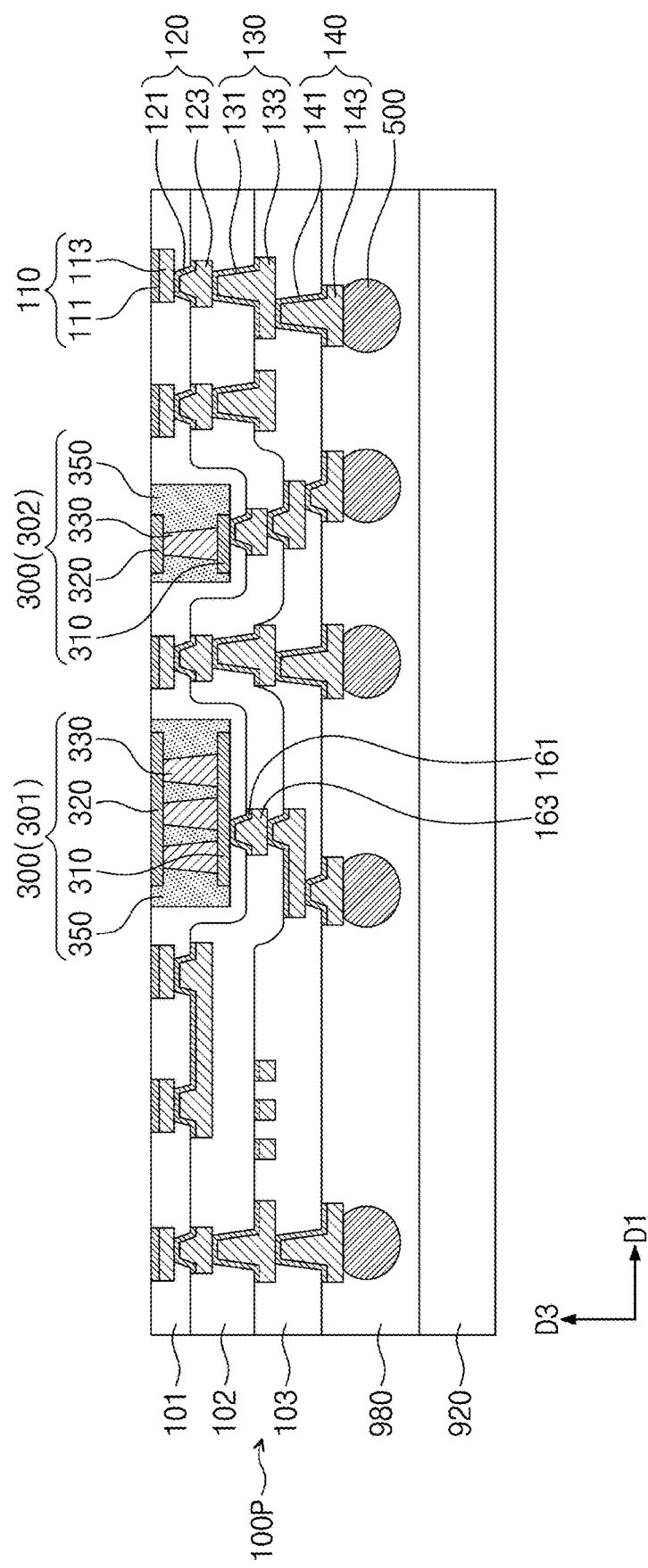
Figure 4I:
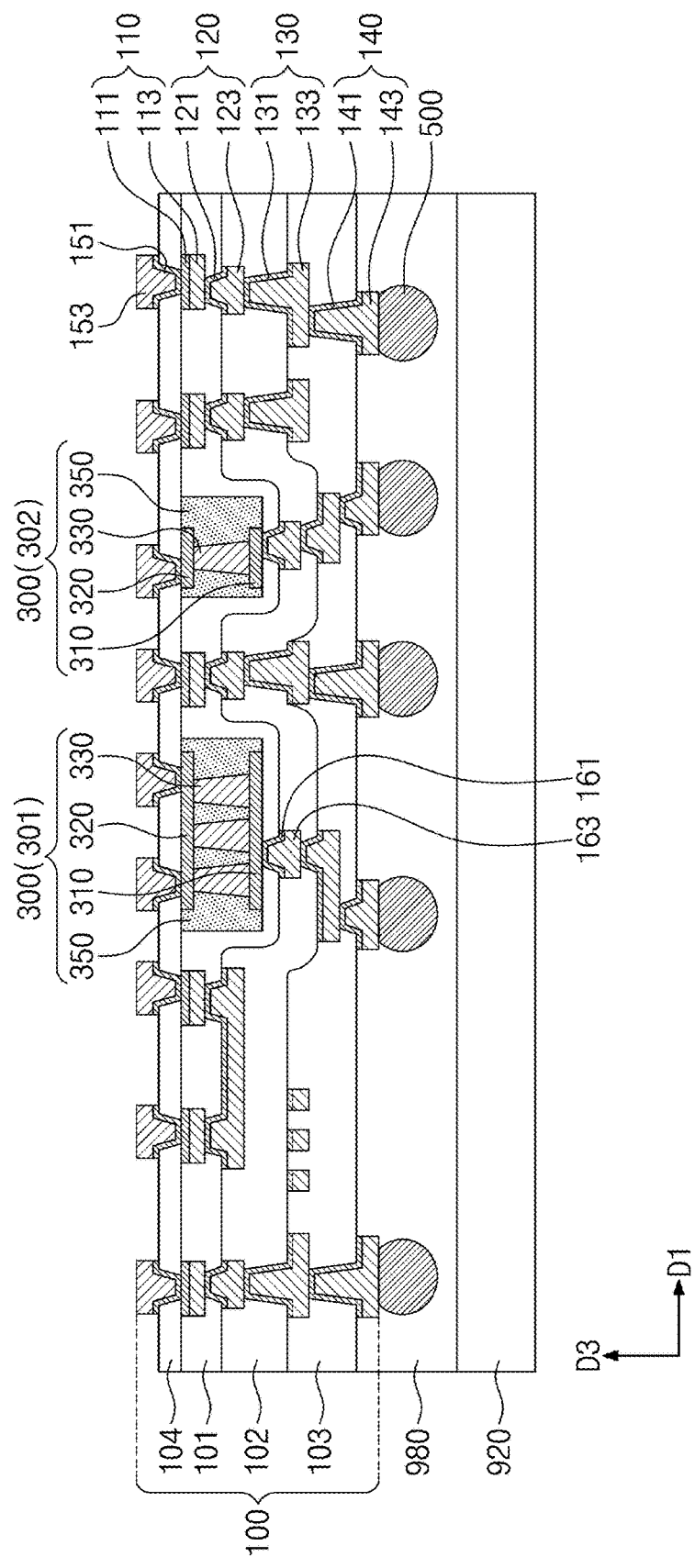

When the capacitors 300 have their thicknesses each of which is greater than about 50% of that of a redistribution substrate 100 which will be manufactured in FIG. 4I, the third dielectric layer 103 may have undulation at a top surface thereof in FIG. 4I. According to embodiments, the capacitors 300 may have their thicknesses each of which is equal to or less than about 50% of that of a redistribution substrate (see 100 of FIG. 4I), and thus, the third dielectric layer 103 may have reduced or no undulation at the top surface thereof in FIG. 4I. For example, the first capacitor 301 and the second capacitor 302 may respectively have a thickness T1 and a second thickness T2 each of which is about 0.1% to about 50% of the thickness of the redistribution substrate 100.

A plurality of fourth redistribution patterns 140 may be formed in the third dielectric layer 103 and on a top surface of the third dielectric layer 103. The fourth redistribution patterns 140 may be connected to corresponding third redistribution patterns 130. Accordingly, the preliminary redistribution substrate 100P may be formed. The preliminary redistribution substrate 100P may include the first dielectric layer 101, the second dielectric layer 102, the third dielectric layer 103, the first redistribution pattern 110, the second redistribution pattern 120, the third redistribution pattern 130, the fourth redistribution pattern 140, the lower seed pattern 161, and the lower conductive pattern 163.

Differently from the explanation of FIGS. 4D and 4E, the lower seed pattern 161 and the lower conductive pattern 163 may be formed by a single process used for forming the third redistribution pattern 130. In this case, the lower seed pattern 161 and the lower conductive pattern 163 may be disposed on the top surface of the second dielectric layer 102, and may penetrate the second dielectric layer 102 and the first dielectric layer 101, thereby being connected to the first terminal 310. For example, the third redistribution pattern 130 may not be connected to the lower conductive pattern 163, and at least one of the fourth redistribution patterns 140 may be connected to the lower conductive pattern 163.

Referring to FIG. 4F, solder patterns 500 may be formed on the preliminary redistribution substrate 100P. According to an embodiment, the solder patterns 500 may be correspondingly formed on top surface of the fourth redistribution patterns 140. For example, the formation of the solder patterns 500 may include performing a solder-ball attaching process.

A second carrier substrate 920 may be disposed on the solder patterns 500 and the third dielectric layer 103. A carrier adhesive layer 980 may be formed between the third dielectric layer 103 and the second carrier substrate 920. The carrier adhesive layer 980 may be interposed between and encapsulate the solder patterns 500. The second carrier substrate 920 may be attached through the carrier adhesive layer 980 to the preliminary redistribution substrate 100P. The placement of the second carrier substrate 920 may be followed or preceded by the formation of the carrier adhesive layer 980.

Referring to FIG. 4G, the preliminary redistribution substrate 100P may be turned upside down to place the second carrier substrate 920 on a bottom surface of the preliminary redistribution substrate 100P. The first carrier substrate 910 may be disposed on a top surface of the preliminary redistribution substrate 100P.

Referring to FIG. 4H, the first carrier substrate 910 and the etch stop layer 990 may be removed to expose a top surface of the first dielectric layer 101, a top surface of the first seed pattern 111, and top surfaces of the capacitors 300. For example, the removal of the first carrier substrate 910 and the etch stop layer 990 may expose a top surface of the base layer 350 in each of the capacitors 300, and may also expose a top surface of the second terminal 320 in each of the capacitors 300. Because the first seed pattern 111 and the capacitors 300 are formed on one surface of the etch stop layer 990 as discussed in the examples of FIGS. 4A to 4C, the first seed pattern 111 may have a top surface at a level substantially the same as that of the top surfaces of the capacitors 300. For example, the top surface of the first seed pattern 111 may be located at a level substantially the same as that of a top surface of the base layer 350 in each of the capacitors 300. The top surface of the first seed pattern 111 may be located at a level substantially the same as that of a top surface of the second terminal 320, but the embodiment is not limited thereto.

Referring to FIG. 4I, a fourth dielectric layer 104 may be formed on a top surface of the first dielectric layer 101, the top surface of the first seed pattern 111, the top surface of the base layer 350, and the top surface of the second terminal 320. The fourth dielectric layer 104 may be in contact with the top surfaces of the capacitors 300. For example, the fourth dielectric layer 104 may be in contact with the top surface of the base layer 350 and the top surface of the second terminal 320 in each of the capacitors 300. The fourth dielectric layer 104 may be formed by a coating process, but the embodiment is not limited thereto.

Upper seed patterns 151 and upper conductive patterns 153 may be formed in and on the fourth dielectric layer 104. The upper seed patterns 151 and the upper conductive patterns 153 may be substantially the same as those discussed in FIGS. 1A to 1C. The processes mentioned above may form a redistribution substrate 100.

Figure 4J:
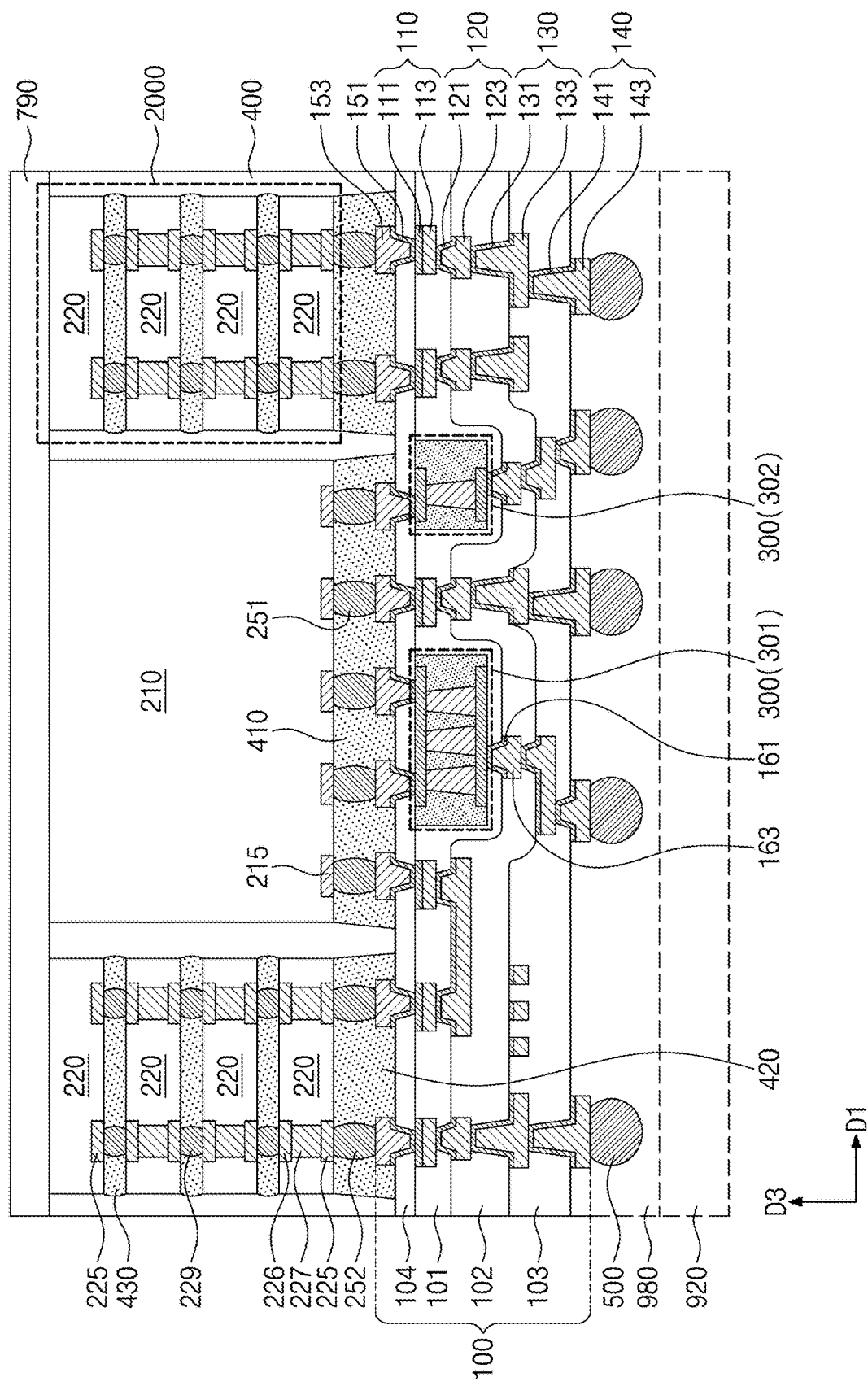

Referring to FIG. 4J, a first semiconductor chip 210 and chip stacks 2000 may be mounted on the redistribution substrate 100. The mounting of the first semiconductor chip 210 may include forming first bonding bumps 251 between chip pads 215 of the first semiconductor chip 210 and their corresponding upper conductive patterns 153. The mounting of the chip stacks 2000 on the redistribution substrate 100 may include forming second bonding bumps 252 between lower pads 225 of lowermost second semiconductor chips 220 and their corresponding upper conductive patterns 153. The chip stack 2000 may be the same as that discussed in the examples of FIGS. 1A to 1C.

A first under-fill layer 410 may be formed between the redistribution substrate 100 and the first semiconductor chip 210. A plurality of second under-fill layers 420 may be formed between the redistribution substrate 100 and a plurality of second semiconductor chips 220. A molding layer 400 may be formed on the redistribution substrate 100 to cover the first semiconductor chip 210 and the chip stacks 2000. The molding layer 400 may undergo a grinding process to expose a top surface of the first semiconductor chip 210 and a top surface of uppermost second semiconductor chip 220s. A conductive plate 790 may further be formed on the first semiconductor chip 210, the molding layer 400, and the uppermost second semiconductor chips 220.

After the formation of the molding layer 400, the second carrier substrate 920 and the carrier adhesive layer 980 may be removed to expose the redistribution substrate 100 and the solder patterns 500 as indicated by dotted lines. For example, a bottom surface of the third dielectric layer 103 may be exposed.

Referring back to FIG. 1B, the redistribution substrate 100 may be disposed on a package substrate 800, and the solder patterns 500 may be aligned with corresponding metal pads 810. The solder patterns 500 and their corresponding metal pads 810 may be connected to electrically connect the redistribution substrate 100 to the package substrate 800. Through the processes mentioned above, the semiconductor package 1 of FIGS. 1A to 1C may be eventually manufactured.

FIGS. 5A to 5E illustrate cross-sectional views showing a method of fabricating a semiconductor package, according to embodiments. A duplicate description will be omitted below. For brevity of description, top and bottom surfaces of a certain component will be discussed based on their related drawing in describing FIGS. 5A to 5C.

Figure 5A:
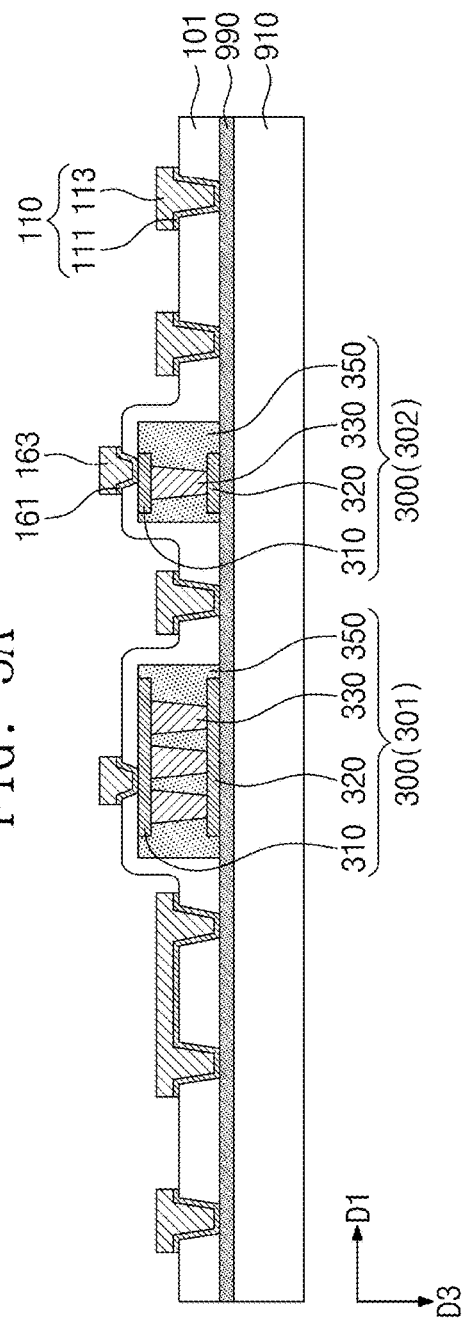
FIGS. 5A to 5E illustrate cross-sectional views showing a method of fabricating a semiconductor package, according to embodiments.

Referring to FIG. 5A, an etch stop layer 990 may be formed on a first carrier substrate 910. The method discussed in the example of FIG. 4A may be used to form the etch stop layer 990. Capacitors 300 may be formed on one surface of the etch stop layer 990. The capacitors 300 may be formed by the processes discussed in the example of FIGS. 4A and 4B.

A first dielectric layer 101 may be formed on one surface of the etch stop layer 990 and also on top surfaces and sidewalls of the capacitors 300.

A first redistribution pattern 110, a lower seed pattern 161, and a lower conductive pattern 163 may be formed in and on the first dielectric layer 101. The formation of the first redistribution pattern 110 may include forming openings in the first dielectric layer 101, forming a seed layer in the openings, forming on the seed layer a resist pattern that has guide openings, performing an electroplating process in which the seed layer is used as an electrode, removing the resist pattern to expose a portion of the seed layer, and etching the exposed portion of the seed layer. The openings may expose the first terminals 310 or a surface of the etch stop layer 990. The guide openings may be spatially connected to corresponding openings. The electroplating process may form a lower conductive pattern 163 and a first metal pattern 113 in each of the openings. The lower conductive pattern 163 and the first metal pattern 113 may fill a lower portion of their corresponding guide opening. The etching of the seed layer may form a first seed pattern 111 and a lower seed pattern 161. The first seed pattern 111 may be laterally spaced apart from the capacitors 300, and may be in contact with the etch stop layer 990. The lower seed pattern 161 may be disposed on one of the capacitors 300, and may be directly connected to the first terminal 310. The lower seed pattern 161 may be spaced apart and electrically separated from the first seed pattern 111. The lower seed pattern 161 and the first seed pattern 111 may be formed in a single process. The lower seed pattern 161 may have substantially the same thickness as that of the first seed pattern 111, and may include the same material as that of the first seed pattern 111.

The first metal pattern 113 may be formed on the first seed pattern 111. The lower conductive pattern 163 may be formed on the lower seed pattern 161. The lower conductive pattern 163 may include the same material as that of the first metal pattern 113.

Figure 5B:
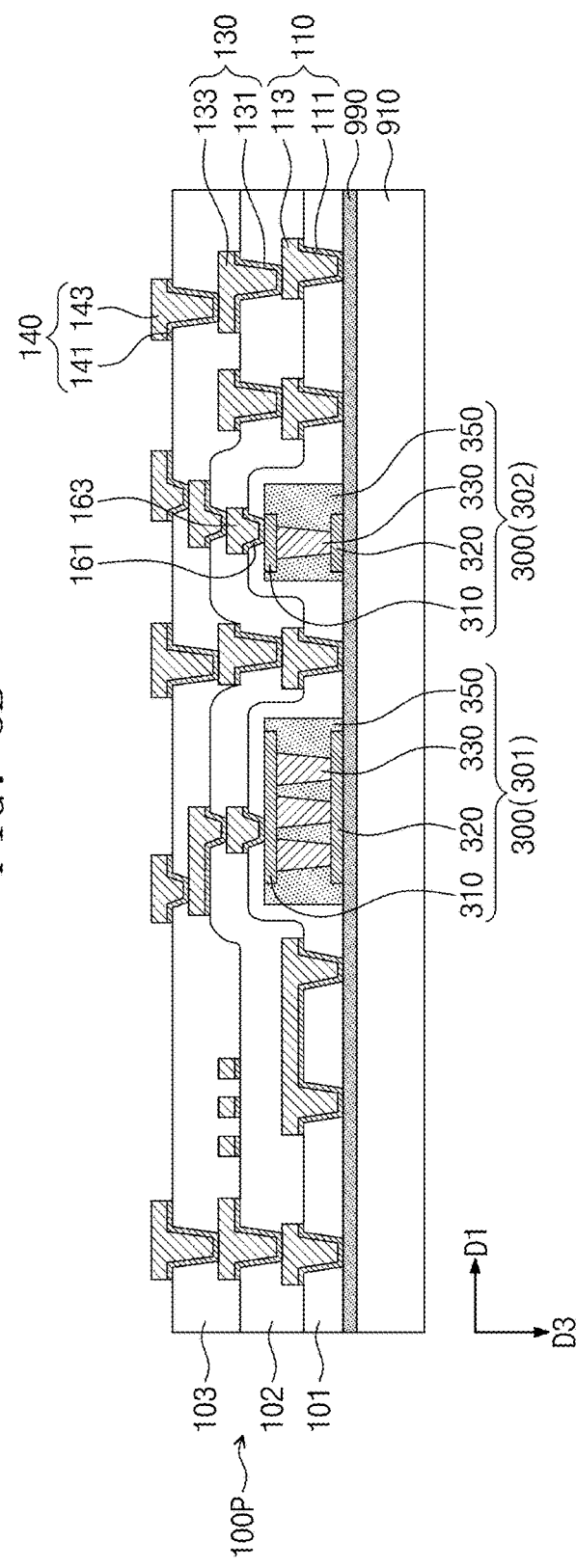

Referring to FIG. 5B, a second dielectric layer 102, third redistribution patterns 130, a third dielectric layer 103, and fourth redistribution patterns 140 may be formed to form a preliminary redistribution substrate 100P. The method discussed in the example of FIG. 4E may be used to form the second dielectric layer 102, the third redistribution patterns 130, the third dielectric layer 103, and the fourth redistribution patterns 140.

Figure 5C:
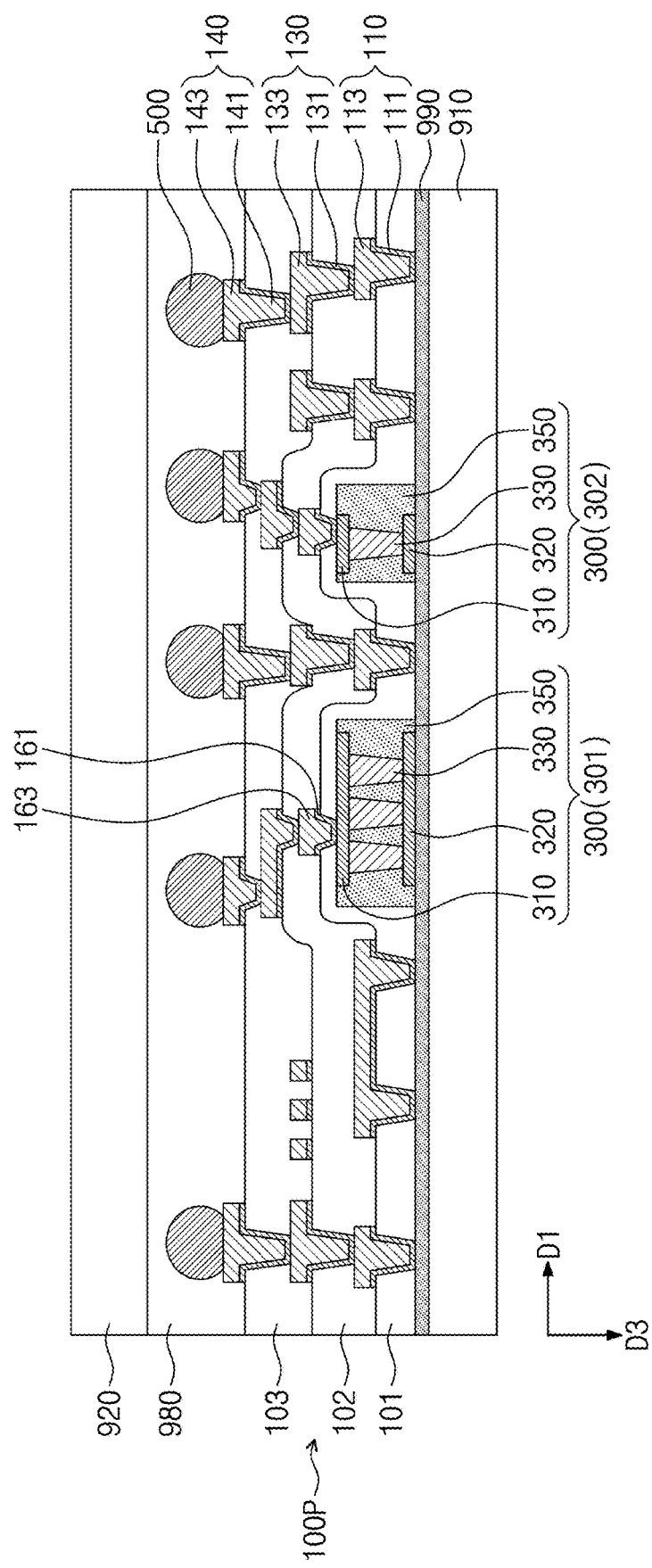

Referring to FIG. 5C, solder patterns 500 may be formed on corresponding fourth redistribution patterns 140. A carrier adhesive layer 980 may be formed on the preliminary redistribution substrate 100P and the third dielectric layer 103. The carrier adhesive layer 980 may cover the solder pattern 500. A second carrier substrate 920 may be attached to the carrier adhesive layer 980. The preliminary redistribution substrate 100P may be fixed through the carrier adhesive layer 980 to the second carrier substrate 920.

Figure 5D:
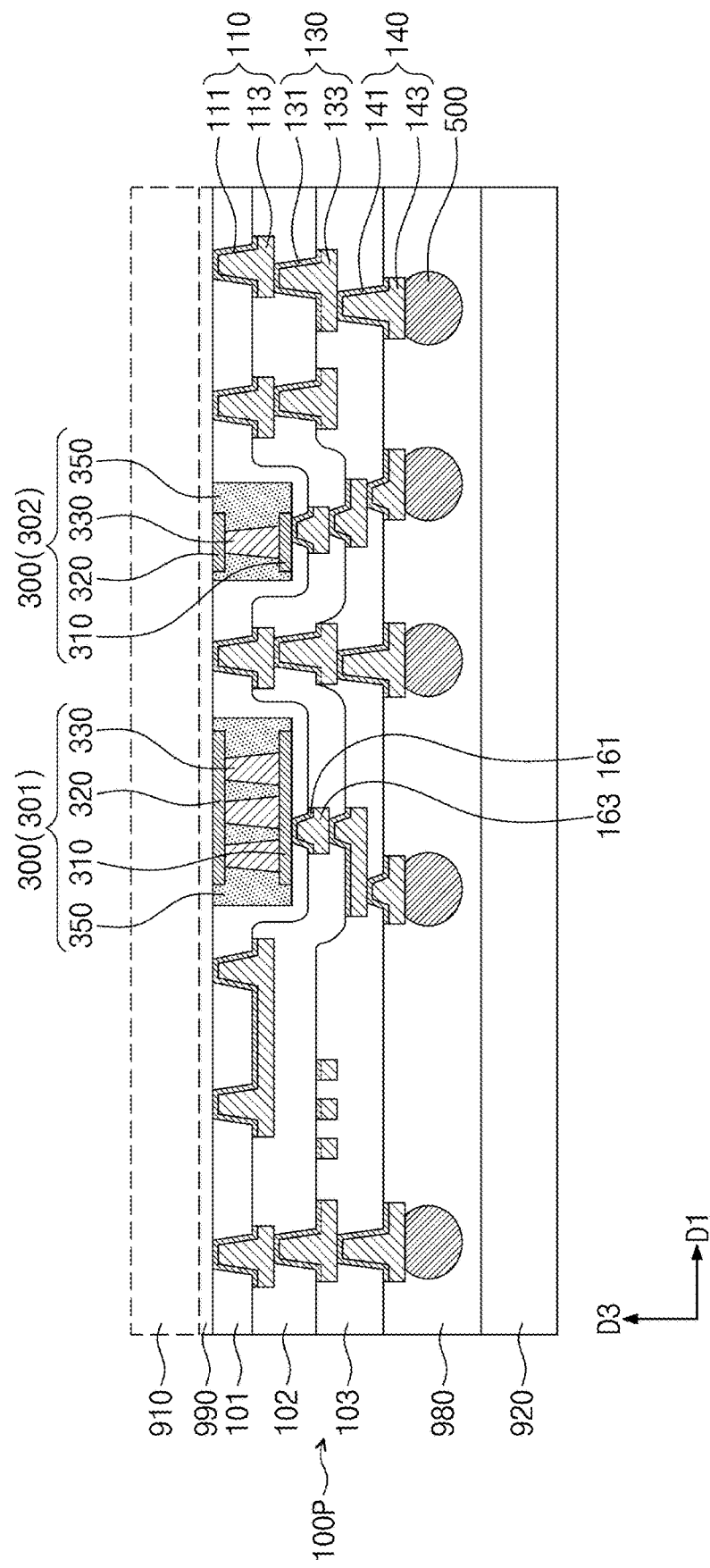

Referring to FIG. 5D, the preliminary redistribution substrate 100P may be turned upside down to place the second carrier substrate 920 on a bottom surface of the preliminary redistribution substrate 100P. Afterwards, as indicated by dotted lines, the first carrier substrate 910 and the etch stop layer 990 may be removed to expose a top surface of the first dielectric layer 101, a first top surface of the first seed pattern 111, and top surfaces of the capacitors 300. For example, the removal of the first carrier substrate 910 and the etch stop layer 990 may expose a top surface of the second terminal 320 in each of the capacitors 300, and may also expose a top surface of the base layer 350 in each of the capacitors 300.

Figure 5E:
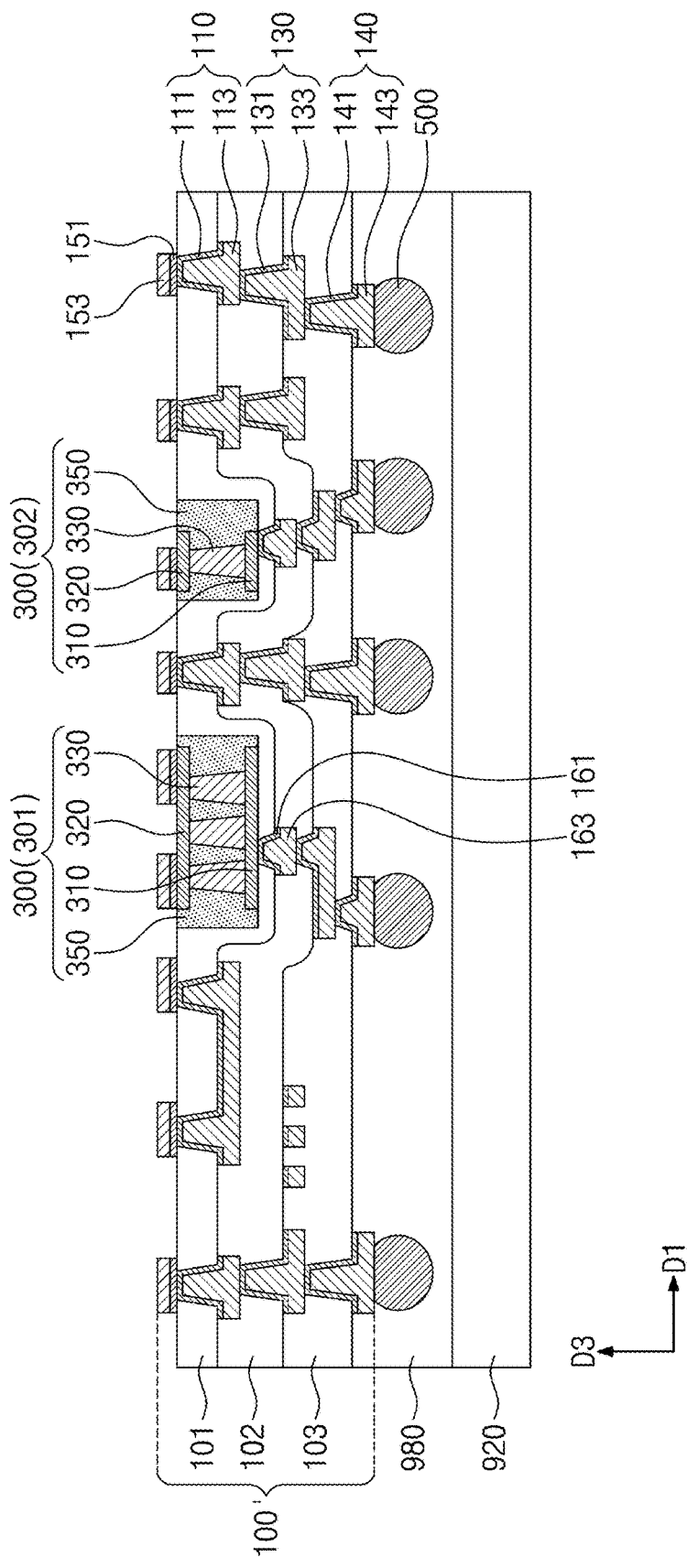

Referring to FIG. 5E, upper seed patterns 151 may be correspondingly formed on the first top surface of the first seed pattern 111 and the top surfaces of the second terminals 320. Upper conductive patterns 153 may be formed on corresponding upper seed patterns 151. Accordingly, a redistribution substrate 100' may be eventually formed.

Referring to FIGS. 5E and 2A, a first semiconductor chip 210 and chip stacks 2000 may be mounted on a top surface of the redistribution substrate 100'. A first under-fill layer 410, second under-fill layers 420, a molding layer 400, and a conductive plate 790 may be formed on the top surface of the redistribution substrate 100'. The second carrier substrate 920 and the carrier adhesive layer 980 may be removed to expose the solder patterns 500 and the third dielectric layer 103. The redistribution substrate 100' may be disposed on the package substrate 800. The solder patterns 500 may be aligned with and connected to corresponding metal pads 810. Accordingly, the semiconductor package 1A of FIGS. 2A and 2B may be eventually fabricated.

Figure 6:
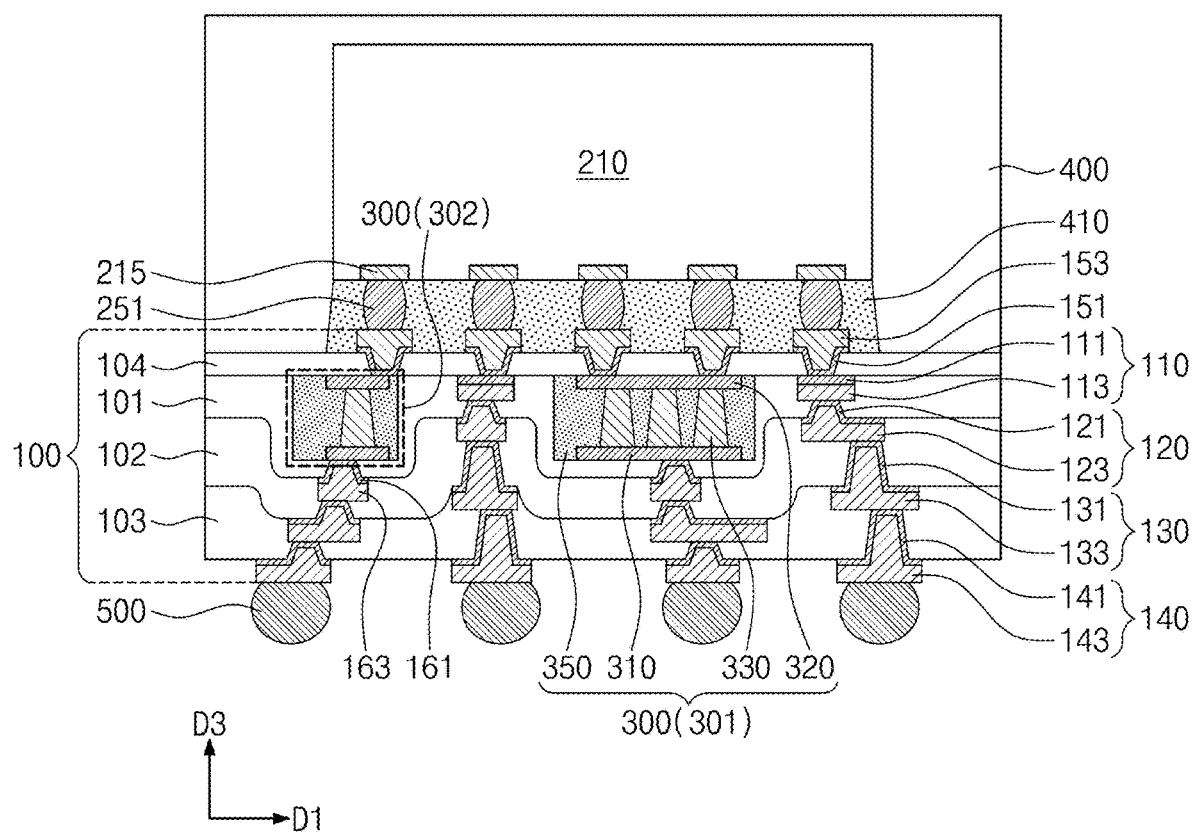
FIG. 6 illustrates a cross-sectional view showing a semiconductor package, according to an embodiment.

FIG. 6 illustrates a cross-sectional view showing a semiconductor package, according to an embodiment.

Referring to FIG. 6, a semiconductor package 2 may include a redistribution substrate 100, capacitors 300, solder patterns 500, a first semiconductor chip 210, first bonding bumps 251, and a molding layer 400. The redistribution substrate 100, the capacitors 300, the solder patterns 500, the first semiconductor chip 210, the first bonding bumps 251, and the molding layer 400 may be substantially the same as those discussed in the examples of FIGS. 1A to 1C. The semiconductor package 2 may further include a first under-fill layer 410. In contrast, the semiconductor package 2 may include neither of the chip stack 2000, the second under-fill layers 420, and the package substrate 800.

Differently from that shown, the semiconductor package 2 may be manufactured using the redistribution substrate 100' discussed in FIGS. 2A and 2B. In this case, the first redistribution pattern 110, the upper seed pattern 151, and the upper conductive pattern 153 may be substantially the same as those discussed in the examples of FIGS. 2A and 2B.

Figure 7:
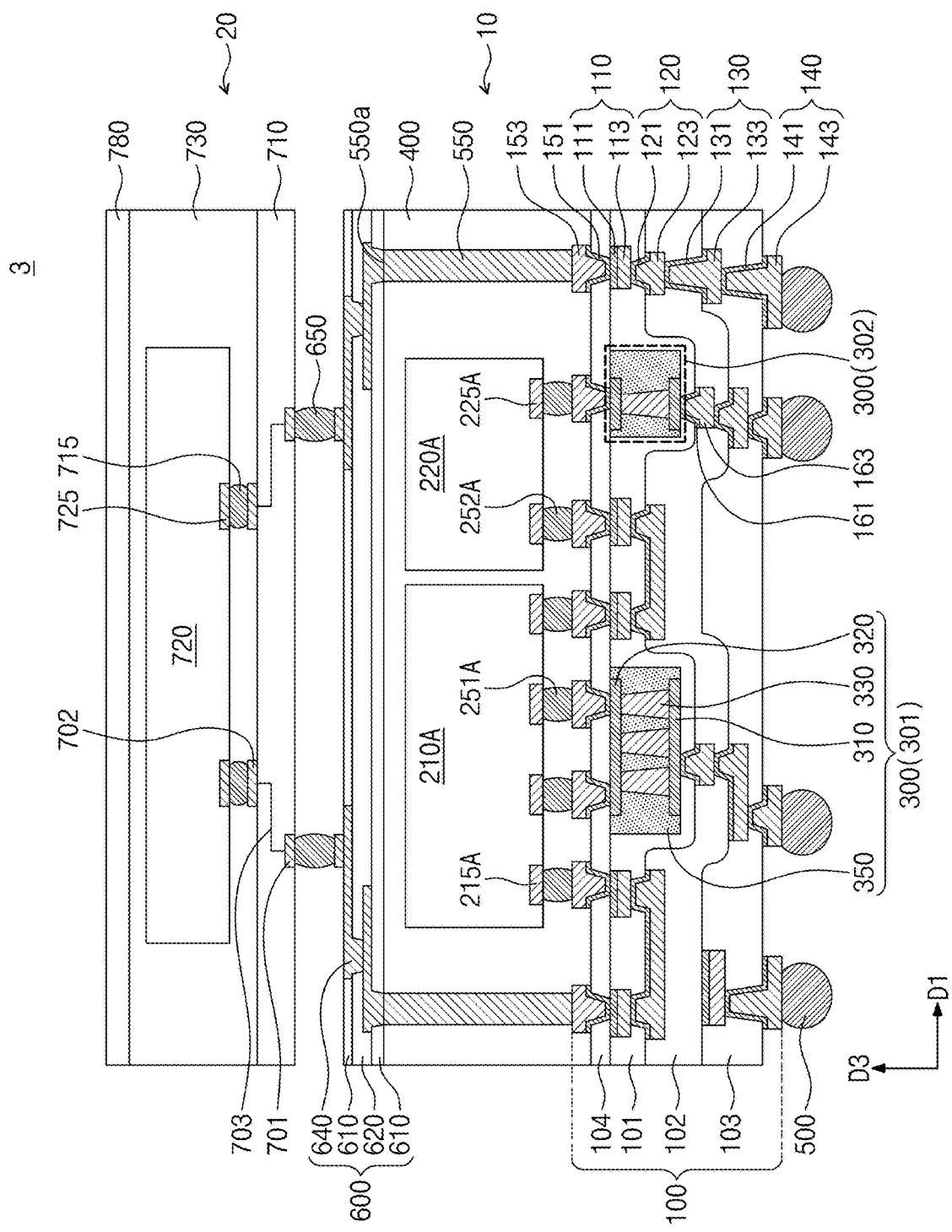
FIG. 7 illustrates a cross-sectional view showing a semiconductor package, according to an embodiment.

FIG. 7 illustrates a cross-sectional view showing a semiconductor package, according to an embodiment.

Referring to FIG. 7, a semiconductor package 3 may include a lower package 10 and an upper package 20. The lower package 10 may include a redistribution substrate 100, capacitors 300, solder patterns 500, first bumps 251A, second bumps 252A, a first lower semiconductor chip 210A, a second lower semiconductor chip 220A, a molding layer 400, and a conductive structure 550. The redistribution substrate 100, the capacitors 300, the solder patterns 500, and the molding layer 400 may be substantially the same as those discussed in the examples of FIGS. 1A to 1C.

The first lower semiconductor chip 210A and the second lower semiconductor chip 220A may be mounted on a top surface of the redistribution substrate 100. The second lower semiconductor chip 220A may be laterally spaced apart from the first lower semiconductor chip 210A. The second lower semiconductor chip 220A may be of a type different from the first lower semiconductor chip 210A. For example, the first lower semiconductor chip 210A may include one of a logic chip, a memory chip, and a power management chip, and the second lower semiconductor chip 220A may include another of a logic chip, a memory chip, and a power management chip. The logic chip may include an application specific integrated circuit (ASIC) chip or an application processor (AP) chip. The power management chip may include a power management integrated circuit (PMIC). For example, the first lower semiconductor chip 210A may be an ASIC chip, and the second lower semiconductor chip 220A may be a power management chip. Each of the first and second lower semiconductor chips 210A and 220A may be analogous to the first semiconductor chip 210 discussed in FIGS. 1A and 1B. Differently from that shown, one or more of the first and second lower semiconductor chips 210A and 220A may be omitted. Alternatively, a third semiconductor chip (not shown) may further be mounted on the top surface of the redistribution substrate 100.

The capacitors 300 may include a first capacitor 301 and a second capacitor 302. At least a portion of the first capacitor 301 may vertically overlap the first lower semiconductor chip 210A. A single or plurality of first capacitors 301 may be provided. At least a portion of the second capacitor 302 may vertically overlap the second lower semiconductor chip 220A. A single or plurality of second capacitors 302 may be provided. Differently from that shown, one or both of the first capacitor 301 and the second capacitor 302 may be omitted.

The first bumps 251A and the second bumps 252A may be respectively similar to the first bonding bumps 251 and the second bonding bumps 252 discussed in FIGS. 1B and 1C. The first lower semiconductor chip 210A may have chip pads 215A that are electrically connected through the first bumps 251A to the redistribution substrate 100 and the first capacitor 301. The second lower semiconductor chip 220A may have chip pads 225A that are electrically connected through the second bumps 252A to the redistribution substrate 100 and the second capacitor 302. The second lower semiconductor chip 220A may be electrically connected through the redistribution substrate 100 to the first lower semiconductor chip 210A.

The redistribution substrate 100 may be provided on its top surface with the conductive structure 550 connected to its corresponding upper conductive pattern 153. The conductive structure 550 may be laterally spaced apart from the first and second lower semiconductor chips 210A and 220A. In a plan view, the conductive structure 550 may be provided on an edge region of the redistribution substrate 100. A metal pillar may be provided on the redistribution substrate 100 to form the conductive structure 550. For example, the conductive structure 550 may be a metallic column. The conductive structure 550 may be electrically connected to the redistribution substrate 100. For example, the conductive structure 550 may be electrically connected through the redistribution substrate 100 to the first lower semiconductor chip 210A, the second lower semiconductor chip 220A, and/or the solder pattern 500. The conductive structure 550 may include metal, such as copper. Differently from that shown, the conductive structure 550 may be electrically connected to one of the capacitors 300.

The molding layer 400 may be disposed on the top surface of the redistribution substrate 100, and may cover the first and second lower semiconductor chips 210A and 220A. The molding layer 400 may cover sidewalls of the conductive structure 550. The molding layer 400 may have a sidewall aligned with that of the redistribution substrate 100. The molding layer 400 may expose a top surface 550a of the conductive structure 550.

The lower package 10 may further include an upper redistribution layer 600. The upper redistribution layer 600 may be provided on a top surface of the molding layer 400. The upper redistribution layer 600 may include an upper dielectric layer 610, an upper redistribution pattern 620, and upper bonding pads 640. The upper dielectric layer 610 may be stacked on the molding layer 400. The upper dielectric layer 610 may include a photosensitive polymer. Each of the upper redistribution patterns 620 may include a via part in the upper dielectric layers 610 and a line part. The via part of the each of the upper redistribution patterns 620 may be in corresponding one of the upper dielectric layers 610. The line part of the each of the upper redistribution patterns 620 may be provided between the upper dielectric layers 610. The upper redistribution pattern 620 may include metal, such as copper. The upper redistribution pattern 620 may be in contact with the top surface 550a of the conductive structure 550. The upper bonding pads 640 may be disposed in the upper dielectric layer 610, and may be connected to the upper redistribution patterns 620. The upper bonding pad 640 may be electrically connected through the upper redistribution pattern 620 and the conductive structure 550 to the solder pattern 500, the first lower semiconductor chip 210A, and/or the second lower semiconductor chip 220A. The presence of the upper redistribution pattern 620 may not allow the upper bonding pad 640 to vertically align with the conductive structure 550.

According to an embodiment, the lower package 10 may be manufactured using the redistribution substrate 100' discussed in the example of FIGS. 2A and 2B.

The upper package 20 may be disposed on the lower package 10. For example, the upper package 20 may be placed on the upper redistribution layer 600. The upper package 20 may include an upper substrate 710, an upper semiconductor chip 720, and an upper molding layer 730. The upper substrate 710 may be a printed circuit board or a redistribution layer. A first connection pad 701 and a second connection pad 702 may be respectively disposed on a bottom surface and a top surface of the upper substrate 710. The upper substrate 710 may be provided therein with a wiring line 703 connected to the first connection pad 701 and the second connection pad 702. The wiring line 703 is schematically illustrated, and may be variously changed in shape and arrangement. The first connection pad 701, the second connection pad 702, and the wiring line 703 may include a conductive material, such as metal.

The upper semiconductor chip 720 may be disposed on the upper substrate 710. The upper semiconductor chip 720 may include integrated circuits (not shown), and the integrated circuits may include a memory circuit, a logic circuit, or a combination thereof. The upper semiconductor chip 720 may be of a type different from the first and second lower semiconductor chips 210A and 220A. For example, the upper semiconductor chip 720 may be a memory chip. A bump terminal 715 may be interposed between the upper substrate 710 and the upper semiconductor chip 720, and may be connected to the second connection pad 702 and a chip pad 725 of the upper semiconductor chip 720. Differently from that shown, the bump terminal 715 may be omitted, and the chip pad 725 may be directly connected to the second connection pad 702.

The upper molding layer 730 may be provided on the upper substrate 710, and may cover the upper semiconductor chip 720. The upper molding layer 730 may include a dielectric polymer, such as an epoxy-based polymer.

The upper package 20 may further include a thermal radiation structure 780. The thermal radiation structure 780 may include a heat sink, a heat slug, or a thermal interface material (TIM) layer. The thermal radiation structure 780 may include, for example, metal. The thermal radiation structure 780 may be disposed on a top surface of the upper molding layer 730. The thermal radiation structure 780 may further extend onto a sidewall of the upper molding layer 730 or a sidewall of the molding layer 400.

The semiconductor package 3 may further include a connection terminal 650. The connection terminal 650 may be interposed between and connected to the upper bonding pad 640 and the first connection pad 701. Therefore, the upper package 20 may be electrically connected through the connection terminal 650 to the first lower semiconductor chip 210A, the second lower semiconductor chip 220A, and/or the solder pattern 500. The connection terminal 650 may include a solder, a bump, or a combination thereof. The connection terminal 650 may include a solder material. An electrical connection with the upper package 20 may mean an electrical connection with integrated circuits in the upper semiconductor chip 720.

According to an embodiment, the upper substrate 710 may be omitted, and the connection terminal 650 may be directly connected to the chip pad 725 of the upper semiconductor chip 720. In this case, the upper molding layer 730 may be in direct contact with a top surface of the upper redistribution layer 600. According to an embodiment, the upper substrate 710 and the connection terminal 650 may be omitted, and the chip pad 725 of the upper semiconductor chip 720 may be directly connected to the upper bonding pad 640.

According to the above embodiments, capacitors are provided in a redistribution substrate, and thus, a semiconductor package including this redistribution substrate may have improved power integrity properties. In addition, the semiconductor package may have improved electrical characteristics.

The above disclosure should not be construed as limiting the inventive concept, and it is intended that the disclosure covers various changes, modifications and combinations of the above embodiments without departing from the spirit and scope of the inventive concept.

What is claimed is:
1. A semiconductor package comprising:
a redistribution substrate;
a package substrate, below the redistribution substrate, comprising a first metal line;
a first solder pattern between the redistribution substrate and the package substrate;
a first passive device in the redistribution substrate, the first passive device comprising a first terminal and a second terminal; and
a first semiconductor chip on a top surface of the redistribution substrate, the first semiconductor chip vertically overlapping at least a portion of the first passive device,
wherein the redistribution substrate comprises:
a dielectric layer in contact with a first lateral surface, a second lateral surface opposite to the first lateral surface, and a bottom surface of the first passive device;
a lower conductive pattern on the first terminal;
a lower seed pattern provided between the first terminal and the lower conductive pattern, and directly connected to the first terminal;
a first upper conductive pattern on the second terminal;
a first upper seed pattern provided between the second terminal and the first upper conductive pattern, and directly connected to the second terminal; and
a first redistribution pattern laterally spaced apart from the first passive device without being connected to the first passive device, and
wherein the first metal line in the package substrate is connected to the first redistribution pattern in the redistribution substrate through the first solder pattern.

2. The semiconductor package of claim 1, wherein the first redistribution pattern comprises:
a first redistribution metal pattern; and
a first redistribution seed pattern on a top surface of the first redistribution metal pattern, and
wherein a top surface of the first redistribution seed pattern is at a level substantially the same as a level of a top surface of the first passive device.

3. The semiconductor package of claim 2, wherein the redistribution substrate further comprises:
a second upper conductive pattern on and connected to the first redistribution seed pattern; and
a second upper seed pattern provided between the first redistribution seed pattern and the second upper conductive pattern.

4. The semiconductor package of claim 1, wherein an interval between a top surface of the first passive device and the top surface of the redistribution substrate is less than an interval between the bottom surface of the first passive device and a bottom surface of the redistribution substrate.

5. The semiconductor package of claim 1, wherein the lower conductive pattern is disposed vertically below the first terminal of the first passive device, and the first upper conductive pattern is disposed vertically above the second terminal of the first passive device.

6. The semiconductor package of claim 1, further comprising a second semiconductor chip, at a side of the first semiconductor chip, on the top surface of the redistribution substrate, the second semiconductor chip not vertically overlapping at least the portion of the first passive device,
wherein the first semiconductor chip is connected to the second semiconductor chip through the first redistribution pattern, and
wherein the first semiconductor chip comprises at least one of an application processor and application specific integrated circuit (ASIC), and the second semiconductor chip comprises a memory.

7. The semiconductor package of claim 1, wherein further comprising a second passive device in the redistribution substrate,
wherein at least a portion of the second passive device does not vertically overlap the first semiconductor chip, and
wherein the first passive device has a greater size than the second passive device.

8. The semiconductor package of claim 5, further comprising:
a second redistribution pattern connected to the lower conductive pattern in the redistribution substrate;
a second solder pattern between the redistribution substrate and the package substrate; and
a second metal wire in the package substrate,
wherein the second metal wire is connected to the second redistribution pattern through the second solder pattern.

9. The semiconductor package of claim 1, further comprising a second passive device in the redistribution substrate, the second passive device being laterally spaced apart from the first passive device by the dielectric layer,
 wherein the semiconductor first chip vertically overlaps at least a portion of the second passive device,
 wherein a thickness of the second passive device is substantially the same as a thickness of the first passive device, and
 wherein a width of the second passive device is different from a width of the first passive device.

10. The semiconductor package of claim 1, further comprising:
 a bonding bump provided between and connected to the first upper conductive pattern and the first semiconductor chip; and
 a second solder pattern on a bottom surface of the redistribution substrate,
 wherein the second solder pattern is electrically connected through the lower conductive pattern to the first terminal.

11. The semiconductor package of claim 1, wherein the first upper conductive pattern is between the first semiconductor chip and a top surface of the first passive device, and
 wherein the lower conductive pattern is on the bottom surface of the first passive device.

12. A semiconductor package comprising:
 a redistribution substrate;
 a first capacitor in the redistribution substrate, the first capacitor comprising a base layer, a first terminal, and a second terminal;
 a first semiconductor chip on a top surface of the redistribution substrate, the first semiconductor chip vertically overlapping at least a portion of the first capacitor,
 wherein the redistribution substrate comprises:
  a dielectric layer in contact with lateral surfaces and a bottom surface of the base layer; and
  a redistribution metal pattern in the dielectric layer and laterally spaced apart from the first capacitor
 wherein the first semiconductor chip is connected to a second semiconductor chip through the redistribution metal pattern.

13. The semiconductor package of claim 12, wherein the redistribution substrate further comprises an upper seed pattern and an upper conductive pattern on the upper seed pattern, and
 wherein the upper seed pattern is between the redistribution metal pattern and the upper conductive pattern.

14. The semiconductor package of claim 13, wherein the upper seed pattern is coupled to the redistribution metal pattern.

15. The semiconductor package of claim 12, further comprising a second capacitor in the redistribution substrate,
 wherein at least a portion of the second capacitor does not vertically overlap the first semiconductor chip, and
 wherein the first capacitor has a greater size than the second capacitor.

16. A semiconductor package, comprising:
 a redistribution substrate;
 a solder pattern on a bottom surface of the redistribution substrate;
 a first semiconductor chip on a top surface of the redistribution substrate;
 a molding layer on the top surface of the redistribution substrate, the molding layer covering the first semiconductor chip;
 a first capacitor in the redistribution substrate, the first capacitor vertically overlapping the first semiconductor chip; and
 a second capacitor disposed side by side with the first capacitor in the redistribution substrate,
 wherein the first capacitor comprises a first base layer, a first terminal, and a second terminal,
 wherein the redistribution substrate comprises:
  a dielectric layer in contact with sidewalls of the first base layer and sidewalls of the second capacitor;
  a lower conductive pattern on the first terminal;
  a lower seed pattern provided between the first terminal and the lower conductive pattern, and directly connected to the first terminal;
  an upper conductive pattern on the second terminal;
  an upper seed pattern provided between the second terminal and the upper conductive pattern and directly connected to the second terminal;
  a first redistribution pattern in the dielectric layer and laterally spaced apart from the first capacitor and the second capacitor; and
  a second redistribution pattern between the first redistribution pattern and the solder pattern,
 wherein a thickness of the second capacitor is substantially the same as a thickness of the first capacitor, and
 wherein a width of the second capacitor is different from a width of the first capacitor.

17. The semiconductor package of claim 16, wherein a top surface of the second capacitor is at a level substantially the same as a level of a top surface of the first capacitor.

18. The semiconductor package of claim 16, wherein the thickness of the first capacitor is about 0.1% to about 50% of a thickness of the redistribution substrate.

19. The semiconductor package of claim 16, further comprising a third capacitor in the redistribution substrate and spaced apart from the first capacitor and the second capacitor,
 wherein a thickness of the third capacitor is the same as the thickness of the first capacitor, and
 wherein a width of the third capacitor is different from the width of the first capacitor and the width of the second capacitor.

20. The semiconductor package of claim 16, further comprising at least one chip stack formed on the top surface of the redistribution substrate,
 wherein the chip stack comprises a plurality of stacked second semiconductor chips, and
 wherein, in a plan view, the first semiconductor chip is formed at a side of the chip stack on the redistribution substrate.

* * * * *